United States Patent [19]

Ishikawa et al.

[11] 4,336,501
[45] Jun. 22, 1982

[54] FREQUENCY CHARACTERISTIC ADJUSTING CIRCUIT

[75] Inventors: Kazumasa Ishikawa, Kawasaki; Shin-ichi Takahashi, Yokohama; Masahide Yoneyama, Kawasaki, all of Japan

[73] Assignee: Nippon Columbia Kabushiki Kaisha, Tokyo, Japan

[21] Appl. No.: 76,765

[22] Filed: Sep. 18, 1979

[30] Foreign Application Priority Data

| Sep. 26, 1978 | [JP] | Japan | 53-118291 |
| Sep. 26, 1978 | [JP] | Japan | 53-118292 |
| Oct. 2, 1978 | [JP] | Japan | 53-121299 |
| Oct. 2, 1978 | [JP] | Japan | 53-121300 |

[51] Int. Cl.$^3$ .............................................. H03 1/34
[52] U.S. Cl. .................................. 330/109; 330/85; 330/126; 330/151; 330/294; 330/304; 333/28 R
[58] Field of Search ............... 330/107, 109, 126, 151, 330/85, 294, 302, 304, 306; 328/167; 333/28 R, 28 T

[56] References Cited

U.S. PATENT DOCUMENTS

| 3,539,937 | 11/1970 | Spaulding | 330/151 |
| 3,921,104 | 11/1975 | Gundry | 333/28 R |
| 4,055,818 | 10/1977 | Gay | 330/151 X |
| 4,122,417 | 10/1978 | Takasaki et al. | 330/107 X |

FOREIGN PATENT DOCUMENTS 2405783 8/1974 Fed. Rep. of Germany ...... 330/109

Primary Examiner—James B. Mullins

[57] ABSTRACT

In a frequency characteristic adjusting circuit having an arrangement of at least one adder, a filter circuit and feedback and/or feed forward means the transfer factors of which and the peak or dip of the filter circuit are freely selectable. Adjustment of the center frequency and Q are independent.

17 Claims, 28 Drawing Figures

FREQUENCY CHARACTERISTIC ADJUSTING CIRCUIT

BACKGROUND OF THE INVENTION

1. Field of the invention

This invention relates to a frequency characteristic adjusting circuit which is capable of setting the frequency characteristic of phase or amplification (or attenuation) degree.

2. Description of the Prior Art

The transfer function T(s) of a frequency characteristic adjusting circuit having such a frequency characteristic (second-order type) as shown in FIG. 1 can be expressed by $$T(s) = \frac{S^2 + (1 + A)\Delta\omega \cdot S + \omega_0^2}{S^2 + (1 + B)\Delta\omega \cdot S + \omega_0^2} \quad (1)$$

The transfer function T(s) of a band-pass filter having such a frequency characteristic (second-order type), as shown in FIG. 1 can be expressed by $$T(s) = \frac{\Delta\omega \cdot S}{S^2 + \Delta\omega \cdot S + \omega_0^2} \quad (2)$$

where $\omega_0$ is the angular velocity of the resonance frequency of the filter and $\Delta\omega$ is the band width of the resonance characteristic of the filter.

The angular velocity of an input signal is represented by $\omega$, and it is set that $S=j\omega$. As is well-known, the equation (1) shows the transfer function of a band-eliminate filter or band-pass filter in dependence on whether $A=0$ or $B=0$.

To obtain the transfer function of the equation (1), use has been made of such a circuit as illustrated in FIG. 3. In FIG. 3, reference numerals 1 and 2 indicate amplifiers, and 3 designates a band-pass filter. However, the band-pass filter heretofore employed is such a dual-slope integration type circuit (biquad circuit) as depicted in FIG. 4 and hence is very complicated in construction. In FIG. 4, reference numeral 4 identifies an adder; 5 and 6 denote integrators; and 7 and 8 represent feedback circuits.

The dual-slope integration type circuit (biquad circuit) has such a construction as shown in FIG. 4 in which the adder 4 and the integrators 5 and 6 are connected in series, and the outputs from the integrators 5 and 6 are positively and negatively fed back via the feedback circuits 8 and 7 respectively to yield a desired output at an output terminal 9 connected to the integrator 5; namely, this circuit has complexity in construction, involving two such feedback circuits.

A method that has been employed for obtaining the transfer function of the equation (2) is to utilize the resonance characteristic of LC; but it is difficult to independently control Q representing the sharpness of a resonance circuit. With the abovesaid dual-slope integration type circuit (biquad circuit), the resonance frequency or Q can be controlled independently, but a very complicated circuit construction is needed therefor.

Letting the transfer function of a second-order type phase shifter be represented by T(S), it is given by $$T(S) = \frac{S^2 - 2a \cdot S + \omega_0^2}{S^2 + 2a \cdot S + \omega_0^2} \quad (3)$$

$\omega_0$ is the angular velocity of a center frequency, where a is a coefficient, $\omega$ is the angular velocity of an input signal and $S=j\omega$. The frequency characteristic in this case is shown in FIG. 5. FIGS. 5A, B and C respectively show the amplification degree, phase and delay time with respect to the angular velocity $\omega$.

In the above equation, a phase characteristic $P(\omega)$ is as follows:

$$P(\omega) = -2\tan^{-1}\frac{2a\omega}{\omega_0^2 - \omega^2}$$

and a group delay characteristic $t(\omega)$ is as follows:

$$t(\omega) = -\frac{\partial P(\omega)}{\partial \omega}$$
$$= 2 \cdot \frac{2a(\omega_0^2 - \omega^2) + 4a\omega^2}{(\omega_0^2 - \omega^2) + 4a^2\omega^2}$$

Accordingly, a maximum delay $t_{max}$ occurs when $\omega = \omega_0$ and becomes as follows:

$$t_{max} = t(\omega_0) = \frac{2}{a}$$

Therefore, in the case of the second-order type, the maximum delay $t_{max}$ can independently be changed relative to the angular velocity $\omega_0$ at the center frequency, by changing the coefficient a independently. However, known phase shifters having the second-order type transfer function, such as the Dellyannis type and the Moschytz type, are complicated in construction, and it is very difficult to change the center frequency and the maximum delay $t_{max}$ independently of each other.

The transfer function T(s) of a frequency characteristic adjusting circuit having such frequency characteristics as shown in FIGS. 15A, B and C is expressed by $$T(s) = \frac{S^2 + K(1 + A)\Delta\omega \cdot S + K^2 \cdot \omega_0^2}{S^2 + (1 + B)\Delta\omega \cdot S + \omega_0^2} \quad (101)$$

or $$T(s) = \frac{S^2 + (1 + A)\Delta\omega \cdot S + K \cdot \omega_0^2}{S^2 + (1 + B)\Delta\omega \cdot S + \omega_0^2} \quad (102)$$

where $\omega_0$ is the angular velocity of the resonance frequency of the filter and $\Delta\omega$ is the band width of the resonance characteristic of the filter. Further, the angular velocity of an input signal is represented by $\omega$, and $S=j\omega$.

The equations (101) and (102) may also be normalized, with $$S = \frac{j\omega}{\omega_0},$$

as follows:

$$T(s) = \frac{S^2 + K(1+A)\frac{\Delta\omega}{\omega_0} \cdot S + K^2}{S^2 + (1+B)\frac{\Delta\omega}{\omega_0} \cdot S + 1} \quad (101')$$

$$T(s) = \frac{S^2 + (1+A)\frac{\Delta\omega}{\omega_0} \cdot S + K}{S^2 + (1+B)\frac{\Delta\omega}{\omega_0} \cdot S + 1} \quad (102')$$

In the above, A, B and K are constants, and as is well-known, T(s) indicates a band-eliminate filter or a band-pass filter in dependence on whether A=0 or B=0, as shown in FIG. 1.

It has conventionally been regarded as difficult to obtain a frequency characteristic adjusting circuit having such a transfer function, and the frequency characteristic adjusting circuit has been put into use only in the case K=1, that is, in such a case as depicted in FIG. 15C; also in this case, a complicated circuit arrangement is required.

SUMMARY OF THE INVENTION

An object of this invention is to provide a simple-structured frequency characteristic adjusting circuit.

Another object of this invention is to provide a frequency characteristic adjusting circuit which is capable of easy adjustment of phase center frequency and amplification degree.

Another object of this invention is to provide a frequency characteristic adjusting circuit which permits easy selection of a peak or dip caused in the frequency characteristic.

Another object of this invention is to provide a frequency characteristic adjusting circuit which has a band-pass or band-eliminate characteristic having different amplification degrees in low- and high-frequency ranges.

Another object of this invention is to provide a frequency characteristic adjusting circuit which has a desired number of peaks or dips.

Yet another object of this invention is to provide a frequency characteristic adjusting circuit which has a second-order type transfer function.

BRIEF DESCRIPTION OF THE DRAWINGS

FIGS. 6 to 14, inclusive, are respectively block diagrams showing examples of the invention;

DESCRIPTION OF THE PREFERRED EMBODIMENTS

Figure 6:
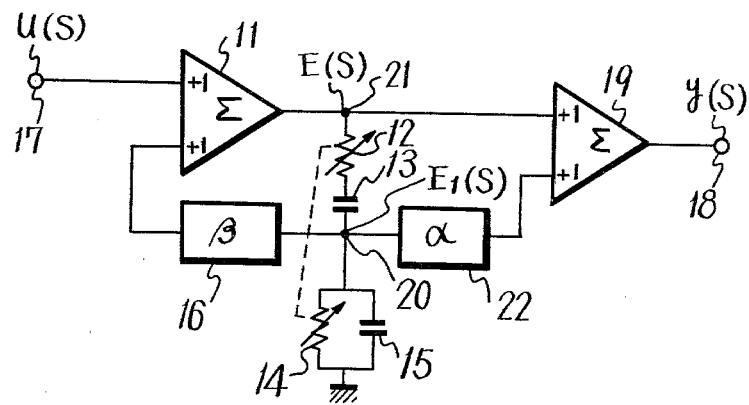

In FIG. 6 illustrating in block form an embodiment of this invention, an input terminal 17 is connected to one of input terminals of a first adder 11. The output 21 from the adder 11 is branched into two, one of which is grounded via a series connection circuit composed of a series circuit of a variable resistor 12 and a capacitor 13 and a parallel circuit of a variable resistor 14 and a capacitor 15. The connection point 20 of the series connection circuit is branched into two, one being connected via a feed-forward circuit 22 to one of input terminals of a second adder 19 and the other being connected via a feedback circuit 16 to the other input terminal of the first adder 11. The output 21 from the first adder 11 is also applied to the other input terminal of the second adder 19, whose output is derived at an output terminal 18. The variable resistors 12 and 14 are ganged to have the same resistance value at all times.

In such a circuit arrangement, letting u(s) represent the voltage at the input terminal 17, E(s) represent the voltage of the output 21 from the adder 11, $E_1(s)$ represent the voltage at the common connection point 20, $\beta$ represent the transfer factor of the feedback circuit 16, $\alpha$ the transfer factor of the feed-forward circuit 22 and $T_1(s)$ represent the transfer function of the line from the output 21 of the first adder 11 to the common connection point 20, they bear the following relationships:

$$E_1(s) = T_1(s) \cdot E(s) \quad (4)$$

$$E(s) = u(s) + \beta \cdot E_1(s) \quad (5)$$

$$y(s) = E(s) + \alpha \cdot E_1(s) \quad (6)$$

Now, in FIG. 6, letting the resistance values of the variable resistors 12 and 14 and the capacitances of the capacitors 13 and 15 be represented by R and C respectively, $T_1(s)$ is given as follows:

$$T_1(s) = \frac{\frac{1}{CR} \cdot S}{S^2 + 3 \cdot \frac{1}{CR} \cdot S + \left(\frac{1}{CR}\right)^2} \quad (7)$$

From the equations (5) and (6), the transfer function T(s) from the input terminal 17 to the output terminal 18 is derived as follows:

$$T(s) = \frac{y(s)}{u(s)}$$
$$= \frac{E(S) + \alpha E_1(s)}{E(s) - \beta E_1(s)}$$

Substituting the equation (4) into the above equation, it follows that $$T(s) = \frac{1 + \alpha T_1(s)}{1 - \beta T_1(s)}$$

Substituting the equation (7) into the above equation, it follows that $$T(s) = \frac{S^2 + (3+\alpha)\frac{1}{CR}S + \left(\frac{1}{CR}\right)^2}{S^2 + (3-\beta)\frac{1}{CR}S + \left(\frac{1}{CR}\right)^2} \quad (8)$$

Accordingly, in order that a frequency characteristic adjusting circuit having the transfer function of the equation (1) is formed by the circuit of FIG. 6, it is necessary first to make a comparison between the equations (1) and (8) to obtain the conditions that makes them equal to each other. Namely, $$\omega_0 = \frac{1}{CR} \quad (9)$$

$$\alpha = (1 + A)\frac{\Delta\omega}{\omega_0} - 3 \quad (10)$$

$$\beta = 3 - (1 + B)\frac{\Delta\omega}{\omega_0} \quad (11)$$

Consequently, by setting the transfer factors $\beta$ and $\alpha$ of the feedback and feed-forward circuits 16 and 22 in FIG. 6 to $\beta$ and $\alpha$ given by the equations (11) and (10) respectively, it is possible to obtain the frequency characteristic adjusting circuit having the transfer function T(s) of the equation (1).

Figure 7:
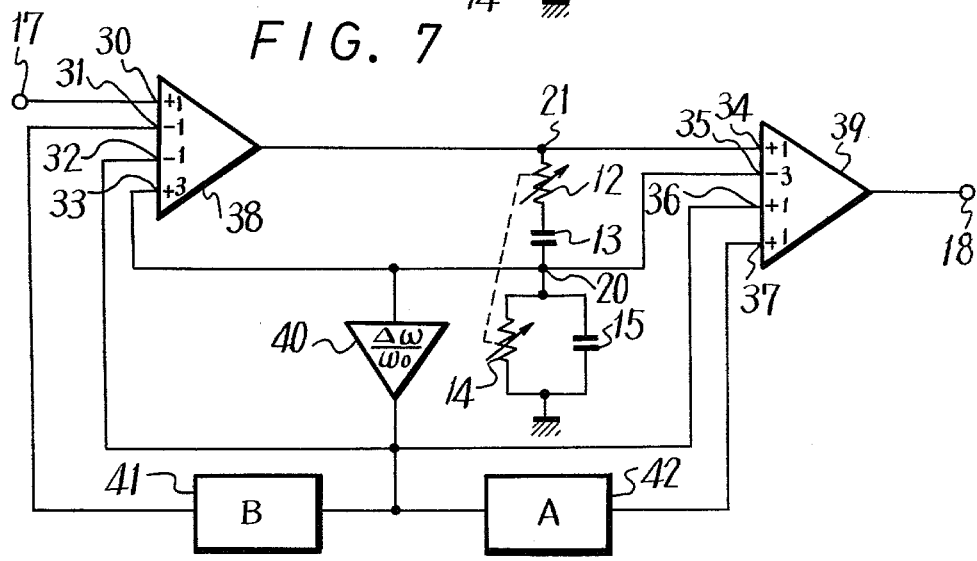

FIG. 7 shows another embodiment of the present invention in which Q ($=\omega_0/\Delta\omega$) representing the sharpness of a resonance circuit and A (or B) related to the amplification (or attenuation) degree at the resonance point are made independently variable by arranging the transfer factors $\beta$ and $\alpha$ of the feedback and feed-forward circuits 16 and 22 in FIG. 6. The parts having the same functions as those in FIG. 6 are identified by the same reference numerals, and no description will be repeated. In FIG. 7, an adder 38 has input terminals 30, 31, 32 and 33, and their adding coefficients are selected to be 1, $-1$, $-1$ and 3 respectively. An adder 39 has input terminals 34, 35, 36 and 37, and their adding coefficients are selected to be 1, $-3$, 1 and 1. The common connection point 20 is connected to the above said input terminals 33 and 35 and an amplifier 40. The output of the amplifier 40 is connected to the above said input terminals 32 and 36 and, at the same time, connected to the input terminals 31 and 37 via amplifiers 41 and 42 respectively.

Figure 8:
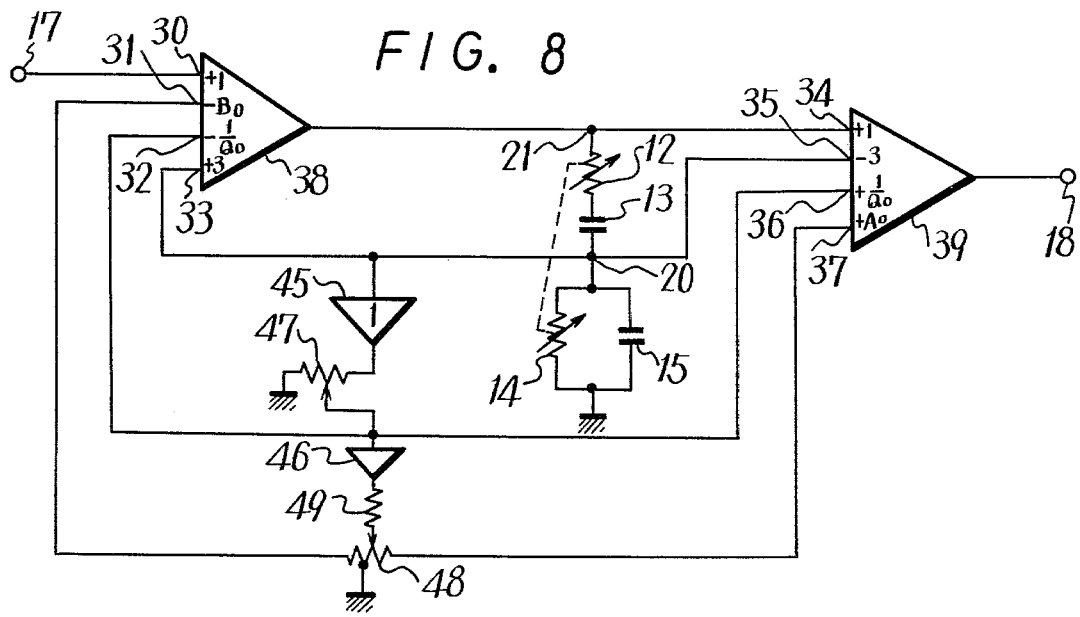

In the above circuit arrangement, by setting the amplification degrees of the amplifiers 40, 41 and 42 to $\Delta\omega/\omega_0$, B and A respectively, the circuit of FIG. 7 is made equivalent to the circuit of FIG. 6. In this case, it is assumed, of course that the circuit of FIG. 6 fulfill the conditions given by the equations (9), (10) and (11). FIG. 8 illustrates another embodiment of this invention in which the amplifier 40 in FIG. 7 is replaced with a variable resistor 47 and the amplifiers 41 and 42 are similarly replaced with a variable resistor 48 having its mid point grounded and a fixed resistor 49 so that the values corresponding to the amplification degrees of the abovementioned amplifiers can easily be set by the variable resistors. In this embodiment, buffer amplifiers 45 and 46 are provided to prevent that the resistance values of the variable resistors are each affected by the other. The amplification degree of the buffer amplifier 45 is set to 1, whereas the amplification degree of the buffer amplifier 46 is set to compensate for attenuation at a maximum value set position of a voltage divider composed of the resistor 49 and the variable resistor 48 so that the overall amplification degree by the combination of the buffer amplifiers 46, the resistor 49 and the variable resistor 48 is 1. The adding coefficient for the input terminals 31, 32, 36 and 37 are selected to be $-B_0$, $-1/Q_0$, $1/Q_0$ and $A_0$ respectively, unlike those in FIG. 7.

Accordingly, by setting the variable resistor 48 to lie on the side of the adder 38, there is provided such a dip characteristic that the attenuation degree at the point of a center frequency $$\omega_0 \text{ is } \frac{1}{1 + B_0}$$

at maximum by virtue of the aforesaid coefficient $-B_0$. When setting the variable resistor 48 to lie on the side of the adder 39, there is obtained such a peak characteristic that the amplification degree at the center frequency $\omega_0$ is $1 + A_0$ at maximum by virtue of the adding coefficient $A_0$. Further, a minimum value of Q becomes $Q_0$ due to the aforesaid adding coefficients $$-\frac{1}{Q_0} \text{ and } \frac{1}{Q_0}.$$

The maximum value of the amplification (attenuation) degree or the minimum value of Q in the above is obtained by setting the slider of the variable resistors 47 and 48 far apart from their grounding points, and by setting each variable resistor at will, desired values of the amplification (or attenuation) degree and Q can be obtained.

In the above, the adders 38 and 39 are each designed so that signals applied to their input terminals are added together after being multiplied by the aforesaid adding coefficients respectively.

Such an adder can easily be obtained by using, for example, an operational amplifier, various input resistors corresponding to the adding coefficients and feedback resistor; therefore, no detailed description will be given in this regard.

In order to use the circuit of FIG. 6 as a frequency characteristic adjusting circuit having the transfer function of the equation (3), it is necessary first to obtain the conditions on which the equations (3) and (8) become equal to each other; namely, $$\alpha = -2\frac{a}{\omega_0} - 3 \quad (12)$$

$$\beta = 3 - 2\frac{a}{\omega_0} \quad (13)$$

$$\omega_0 = \frac{1}{CR} \quad (14)$$

Accordingly, the phase shifter expressed by the equation (2) can be obtained by using $\alpha$ and $\beta$ of the equations (12) and (13) as the amplification degrees of the feed-forward circuit 22 and the feedback circuit 16 in the embodiment of FIG. 6, respectively, and by setting the resistance value R and the capacitance value C of the aforesaid series connection of the variable resistor and the capacitor to bear such a relationship as given by the equation (14). In this case, the center frequency $\omega_0$ can be made variable by changing the resistance values of the variable resistors 12 and 14.

Figures 9, 10, 11:
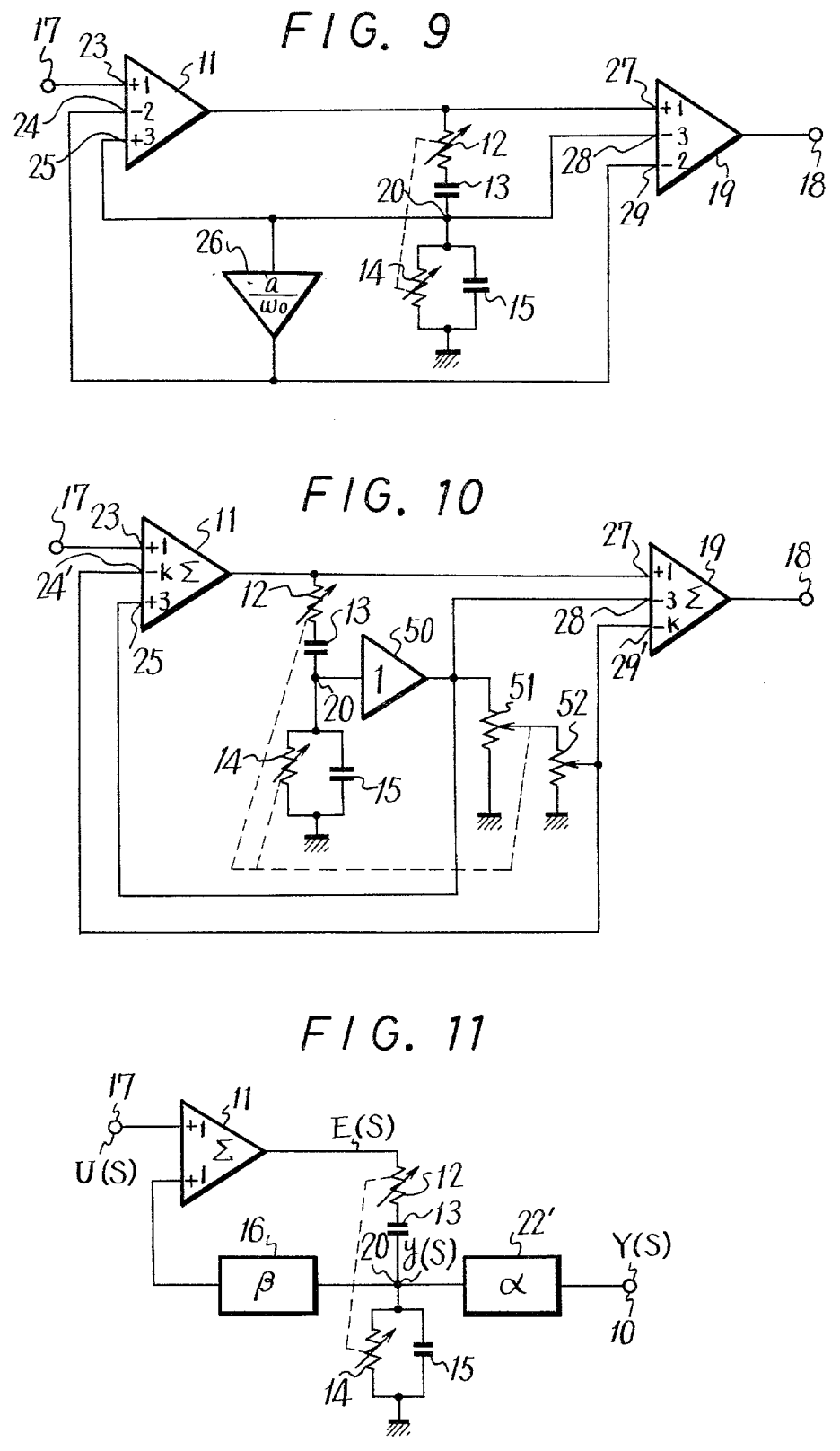

FIG. 9 shows a modified form of the embodiment of FIG. 6, in which parts common to those in the latter are identified by the same reference numerals and no description will be repeated.

In FIG. 9, the common connection point 30 is branched into three, one being connected an amplifier 26 having an amplification degree of $a/\omega_0$ and the others being connected to input terminals 25 and 28 of the adders 11 and 19 respectively. The input terminal 17 is connected to an input terminal 23 of the adder 11. An input terminal of the adder 19 supplied with the output from the adder 11 is used as an input terminal 27.

The adding coefficients for the input terminals 23, 24 and 25 of the adder 11 are respectively set to 1, -2 and 3, and the adding coefficients for the input terminals 27, 28 and 29 of the adder 19 are respectively set to 1, -3 and -2.

With the above arrangement, the embodiment of FIG. 6 satisfying the equations (12), (13) and (14) is equivalent to the embodiment of FIG. 9. In the embodiment of FIG. 6, the amplification degrees of the feedback circuit 16 and the feedforward circuit 22 include a term $a/\omega_0$, whereas in the embodiment of FIG. 9, the term $a/\omega_0$ is included in an amplifier 26 alone. Consequently, in the embodiment of FIG. 9, the value of $a/\omega_0$ can easily be varied.

Since $t_{max} = 2/a$ as mentioned previously, the maximum value of the delay time can be varied independently by changing the factor a independently.

An embodiment of FIG. 10 is intended to achieve such an object. In FIG. 10, parts corresponding to those in FIG. 9 are identified by the same reference numerals and no description will be given of them.

In FIG. 10, the common connection point 20 is connected to the input terminals 25 and 28 of the adders 11 and 19 via a buffer amplifier 50 and to a resistance-type potential divider 51 grounded at one end. A slider of the resistance-type potential divider 51 is connected to another resistance-type potential divider 52, whose slider is, in turn, connected to input terminals 24' and 29' of the adders 11 and 19.

The ratios of addition (adding coefficients) to signals applied to the input terminals 23, 24' and 25 of the adder 11 are respectively set to 1, -K and 3. The ratios of addition to signals applied to the input terminals 27, 28 and 29' of the adder 19 are respectively set to 1, -3 and -K. In this case, K is an arbitrary constant. The resistance-type potential divider 51 is made variable in ganged relation to the variable resistors 12 and 14 in such a manner that the resistance value between the slider of the resistance-type potential divider 51 and the ground varies in proportion to the resistance values R of the variable resistors 12 and 14. As a consequence, the output from the resistance-type potential divider 51 is in inverse proportion to the center frequency $\omega_0$, that is, in proportion to $1/\omega_0$, as seen from the equation (14). With the resistance-type potential divider 52, it is possible to change the feedback and feed-forward quantities for the both adders without losing the proportional relationship to the $1/\omega_0$.

Accordingly, the output from the resistance-type potential divider 52 corresponds to an independent change of a in the amplification degree $a/\omega_0$ of the amplifier 26 in FIG. 9. As a result of this, the maximum value $t_{max}$ of the delay time can be altered independently, as described previously.

In FIG. 10, the adding coefficients -K for the input terminals 24' and 29' define a minimum settable value of the maximum value $t_{max}$ of the delay time, and by the resistance-type potential dividers, the maximum value $t_{max}$ can be set over a range larger than the minimum value.

In connection with FIG. 6, the adding coefficients for the input terminals of the adders 11 and 19 are each described to be 1, but they are not limited specifically thereto; for example, the adding coefficients for the input terminal of the adder 11 connected with the input terminal 17 and the input terminal of the adder 19 supplied with the output from the adder 11 may also be set to -1.

In such a case, the output appearing at the output terminal 18 is displaced 180° apart in phase from the output provided in the embodiment of FIG. 6.

FIG. 11 is another modified form of the embodiment of FIG. 6, which employs an amplifier 22' in place of the feed-forward circuit 22 and takes out an output from an output terminal 10 of the amplifier 22'. With this circuit construction, it is possible to obtain a band-pass filter having such a transfer function as given by the equation (2).

In FIG. 11, letting u(s) represent the voltage at the input terminal 17, y(s) represent the voltage at the common connection point 20, Y(s) represent the voltage at the output terminal 10, E(s) represent the output from the adder 11, $\beta$ represent the amplification degree of the feedback circuit 16, $\alpha$ represent the amplification degree of the amplifier 19 and $T_1(s)$ represent the transfer function from the output terminal of the adder 11 to the common connection point 20, they bear the following relationships:

$$E(s) = u(s) - \beta T_1(s) \cdot E(s) \tag{15}$$

$$Y(s) = \alpha \cdot T_1(s) \cdot E(s) \tag{16}$$

Letting the resistance values of the resistors 12 and 14 and the capacitance values of the capacitors 13 and 15 be represented by R and C respectively, $T_1(s)$ is given as follows:

$$T_1(s) = \frac{\frac{1}{CR} s}{s^2 + 3\left(\frac{1}{CR}\right) s + \left(\frac{1}{CR}\right)^2} \tag{17}$$

From the equation (15) it follows that $$u(s) = e(s) - \beta \cdot T_1(s) \cdot E(s)$$

Consequently, the transfer function $T_1(s)$ from the input terminal 17 to the output terminal 10 becomes as follows:

$$T_1(s) = \frac{Y(s)}{u(s)} \tag{18}$$

$$= \frac{\alpha \cdot T_1(s) \cdot E(s)}{E(s) - \beta T_1(s) \cdot E(s)}$$

$$= \frac{\alpha \cdot T_1(s)}{1 - \beta \cdot T_1(s)} \tag{19}$$

Substituting the equation (17) into the above equation, it follows that $$T(s) = \frac{\frac{1}{CR} \cdot \alpha}{s^2 + (3 - \beta)\frac{1}{CR} \cdot s + \left(\frac{1}{CR}\right)^2} \tag{20}$$

Accordingly, the conditions for making the equations (20) and (2) equal to each other are as follows:

$$\Delta\omega = \frac{\alpha}{CR} \tag{21}$$

$$\Delta\omega = \frac{3-\beta}{CR} \qquad (22)$$

$$\omega^2 = \left(\frac{1}{CR}\right)^2 \qquad (23)$$

Therefore, from the quations (21), (22) and (23) it follows that $$\alpha = \frac{\Delta\omega}{\omega_0} \qquad (24)$$

$$\beta = 3 - \frac{\Delta\omega}{\omega_0} \qquad (25)$$

$$CR = \frac{1}{\omega_0} \qquad (26)$$

By setting the values of $\alpha$ and $\beta$ in the circuit of FIG. 11 to satisfy the equations (24) and (25) as described above, the transfer function from the input terminal 17 to the output terminal 10 is made equal to the transfer function given by the equation (2).

Further, the center frequency $\omega_0$ can be changed by changing the resistance values of the variable resistors 12 and 14 in ganged relation to each other.

The amplification degree A at the resonance point can freely be set by setting the amplification degree of the amplifier 22′ in FIG. 11 to $(\Delta\omega)/(\omega_0)\cdot A$. That is, since this can be achieved by making the resultant signal multiple by A, A-fold, it is possible to employ various methods such as connecting an amplifier having am amplification degree of A to the input terminal 17.

In FIG. 11, the amplifier 22′ is connected between the common connection point 20 and the output terminal 10, but even if it is connected to the input terminal 17, exactly the same results are obtained.

Figure 12:
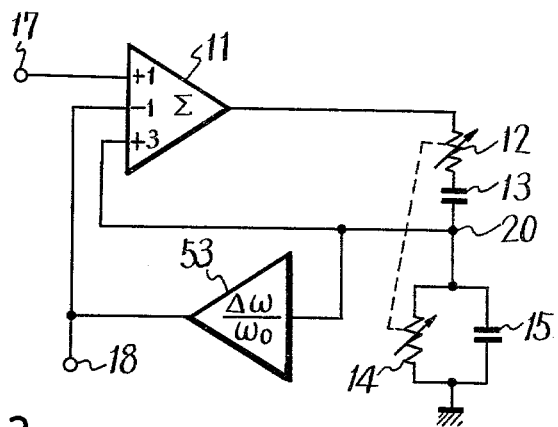

FIG. 12 shows a modified form of the embodiment of FIG. 11, in which the feedback circuit 16 and the amplifier 22′ are substituted with other circuits equivalent thereto and in which the common connection point 20 is branched to two, one of which is connected directly to the adder 11. In this case, the adding coefficient of the adder 11 is 3, whereas the adding coefficient for the input terminal 17 is 1. The other line branched from the common connection point 20 is connected to the adder 11 via an amplifier 53 having an amplification factor $\Delta\omega/\omega_0$ and to the output terminal 18. The adding coefficient in this case is selected to be $-1$. With such an arrangement, $\Delta\omega/\omega_0$ can be altered by changing the amplification degree of the amplifier 53, so that Q representing the sharpness of the resonance circuit is varied.

Figure 13:
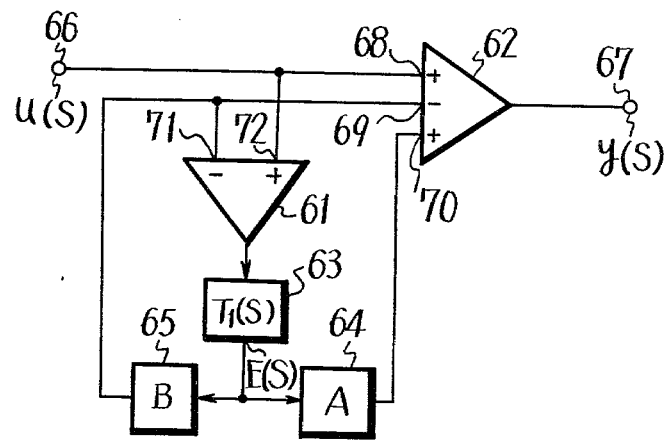

FIG. 13 illustrates an embodiment of a frequency characteristic adjusting circuit having desired numbers of peaks and dips in accordance with the present invention.

In FIG. 13, an input terminal 66 is connected to input terminals 68 and 72 of first and second adders 61 and 62. The output of the first adder 61 is connected via a bandpass filter 63 to first and second coefficient circuits 64 and 65. The output of the first coefficient circuit 64 is connected to an input terminal 70 of the second adder 62, and the output of the second coefficient circuit 65 is connected to input terminals 71 and 69 of the first and second adders 61 and 62. The adders 61 and 62 are each adapted so that signals applied to their input terminals are multiplied by the adding coefficients corresponding thereto and then added together. In FIG. 13, the adding coefficients for the input terminals 68, 69, 70, 71 and 72 of the adders 61 and 62 are selected to be 1, $-1$, 1, $-1$ and 1 respectively. Such an adder can easily be obtained by using an operational amplifier having inverting and non-inverting input terminals; therefore, no detailed description will be given thereof.

In the above arrangement, letting the voltage at the input terminal 66, the voltage at an output terminal 67, the output voltage of the band-pass filter 63 and the transfer function of the band-pass filter 63 be represented by u(s), y(s), E(s) and $T_1(s)$ respectively, they bear the following relationships:

$$\{u(s) - BE(s)\}T_1(s) = E(s) \qquad (31)$$

$$u(s) - BE(s) + AE(s) = y(s) \qquad (32)$$

where A and B are the amplification degrees of the coefficient circuits 64 and 65 respectively.

Here, the transfer function T(s) from the input terminal 66 to the output terminal 67 becomes as follows:

$$T(s) = \frac{y(s)}{u(s)} \qquad (33)$$

Accordingly, from the equations (31), (32) and (33) the transfer function T(s) becomes as follows:

$$T(s) = \frac{1 + AT_1(s)}{1 + BT_1(s)} \qquad (34)$$

The transfer function $T_1(s)$ of the band-pass filter 63 is selected as follows:

$$T_1(s) = \frac{\Delta\omega S}{S^2 + \Delta\omega S + \omega_0^2} \qquad (35)$$

Substituting the equation (35) into the equation (34), it follows that $$T(s) = \frac{S^2 + (1 + A)\Delta\omega S + \omega_0^2}{S^2 + (1 + B)\Delta\omega S + \omega_0^2} \qquad (36)$$

which is the same as the equation (1). In the equations (35) and (36), $S = j\omega$, but if normalized with $$S = \frac{j\omega}{\omega_0},$$

the equations (35) and (36) can be expressed as the following equations (35′) and (36′):

$$T_1(s) = \frac{\frac{\Delta\omega}{\omega_0} \cdot S}{S^2 + \frac{\Delta\omega}{\omega_0} S + 1} \qquad (35')$$

$$T(s) = \frac{1 + \frac{A\frac{\Delta\omega}{\omega_0} S}{S^2 + \frac{\Delta\omega}{\omega_0} S + 1}}{1 + \frac{B\frac{\Delta\omega}{\omega_0} S}{S^2 + \frac{\Delta\omega}{\omega_0} S + 1}} \qquad (36')$$

Figure 1:
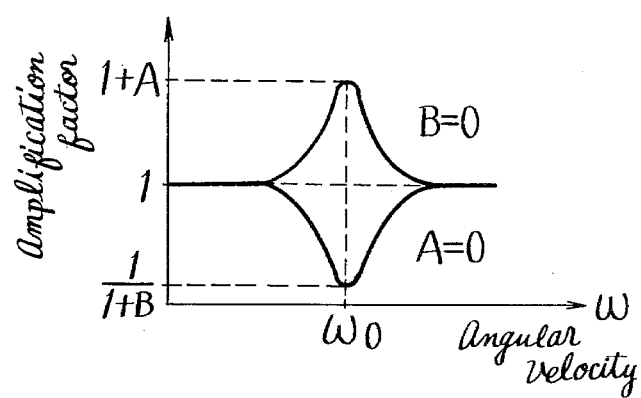
FIGS. 1 and 2 are respectively graphs showing frequency characteristics.
Figure 2:
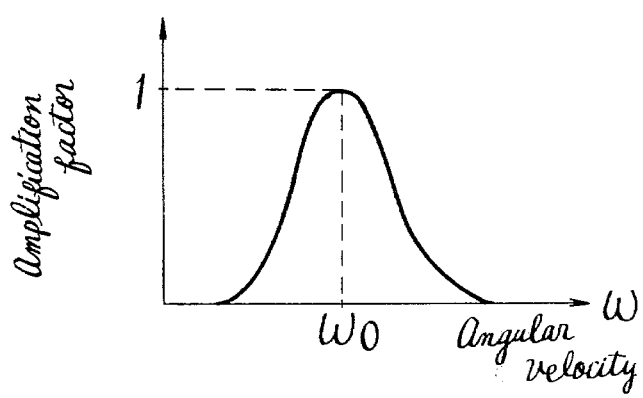
Figure 3:
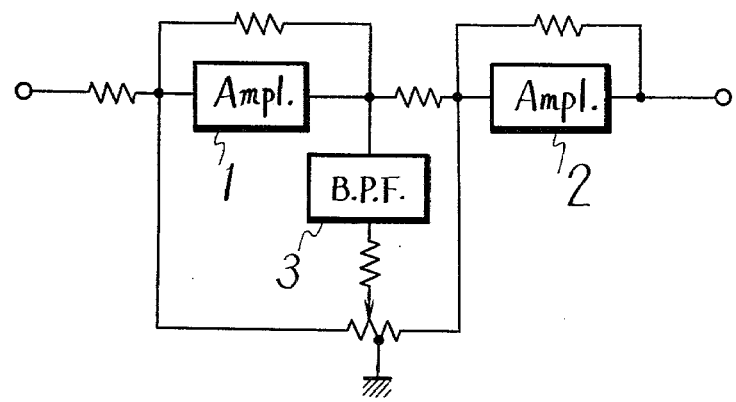
FIG. 3 is a connection diagram of a circuit which obtains the transfer function of the equation (1)
Figure 4:
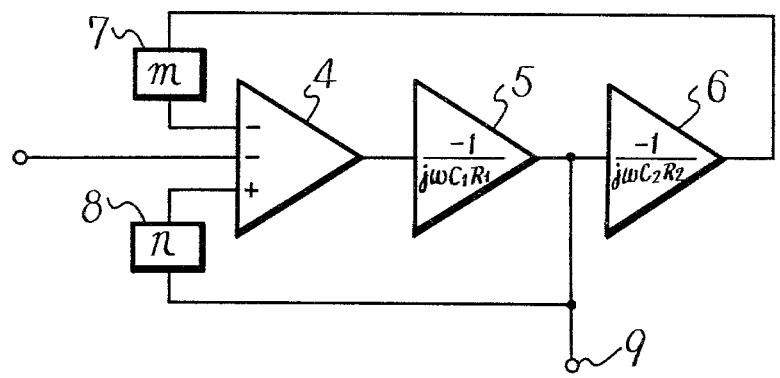
FIG. 4 is a block diagram showing a prior art a dual-slope integration type circuit.
Figure 5A:
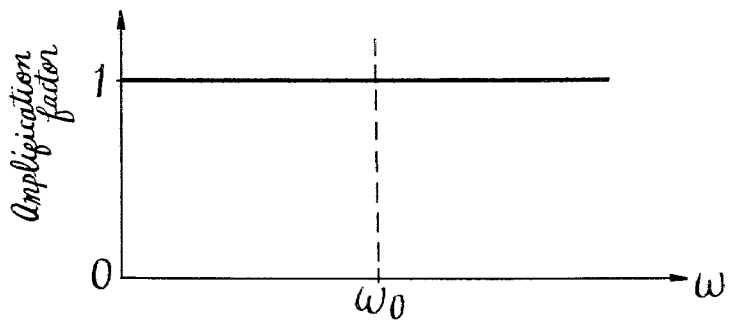
FIGS. 5A, 5B and 5C are graphs showing the relations between the amplification factor phase and delay time and angular velocity $\omega$.
Figure 5B:
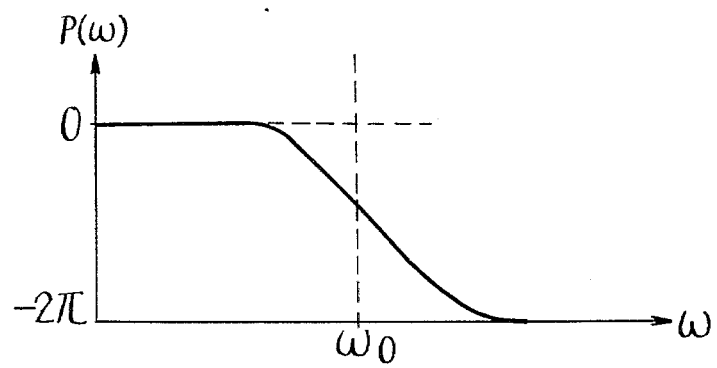
Figure 5C:
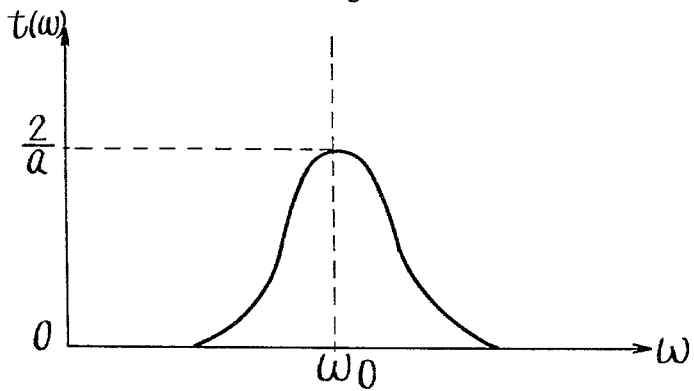

The frequency characteristic of the equation (36) becomes as shown in FIG. 1. If either one of A and B is zero, then the equation (36) provides the characteristic of a band-eliminate filter or band-pass filter with A or B corresponding to zero. Of course, either one of A and B need not always be zero. Since the resonance frequency and Q of the circuit depend on the characteristic of the band-pass filter 63, it is advisable to employ as the band-pass filter 63, a filter capable of adjusting the resonance frequency and Q of the circuit independently of each other. To this end, various band-pass filters can be used.

Figure 14:
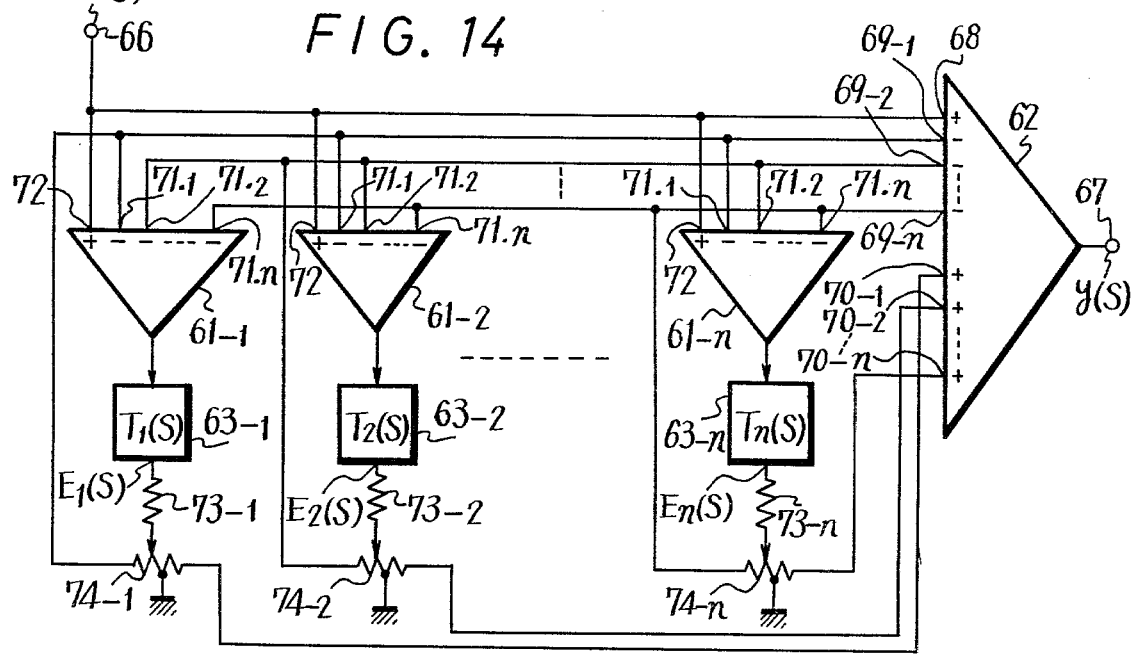

Referring next to FIG. 14, a description will be given in respect of another embodiment of the frequency characteristic adjusting circuit of this invention which has a plurality of resonance points.

In FIG. 14, parts corresponding to those in FIG. 13 are identified by the same reference numerals, and no detailed description will be made thereof. In FIG. 14, the input terminal 66 is connected to the input terminal 72 of each of first adders 61-1 to 61-n and the input terminal 68 of the second adder 62, and the outputs of the first adders 61-1 to 61-n are respectively connected to sliders of variable resistors 74-1 to 74-n via band-pass filters 63-1 to 63-n and resistors 73-1 to 73-n. The variable resistors 74-1, 74-2, ... 74-n are grounded at the mid point and connected at one end to input terminals 70-1 to 70-n of the second adder 62 respectively. The other ends of the variable resistors 74-1 to 74-n are connected to input terminals 71-1 to 71-n of the first adders 61-1 to 61-n and input terminals 69-1 to 69-n of the second adder 62 respectively. Attenuator circuits respectively formed by the resistors 73-1 to 73-n and the variable resistors 74-1 to 74-n corresponding thereto each correspond to the coefficient circuits 64 and 65 provided in FIG. 13, and the aforesaid amplification degree B or A becomes zero in dependence on whether the slider of each variable resistor is set on the side of feeding back to the first adder 61.

In the above arrangement, of respective transfer factors dependent on the setting positions of the variable resistors, let the transfer factors corresponding to the coefficient circuits 64 and 65 be represented by Ai and Bi respectively; let the transfer function of the band-pass filter 63 and its output terminal voltage be represented by Ti(s) and Ei(s) respectively, i being 1,2, ... n; and let the voltages at the input and terminals 66 and 67 be represented by u(s) and y(s) respectively. Then, $$Ei(s) = \{u(s) - \Sigma Bi \cdot Ei(s)\} Ti(s) \quad (37)$$

$$y(s) = u(s) + \Sigma Ei(s) \cdot (Ai - Bi) \quad (38)$$

From the equation, it follows that $$Ei(s) + Ti(s)\Sigma Bi \cdot Ei(s) = u(s) \cdot Ti(s) \quad (39)$$

Expressing the equation (39) in terms of a matrix, the following equation is resulted:

$$\begin{bmatrix} 1 + B_1 \cdot T_1(s) & B_2 T_1(s) & B_n T_1(s) \\ B_1 T_2(s) & \ddots & B_n T_2(s) \\ \vdots & & \vdots \\ B_1 \cdot T_n(s) & \cdots & 1 + B_n T_n(s) \end{bmatrix} \begin{bmatrix} E_1(s) \\ E_2(s) \\ \vdots \\ E_n(s) \end{bmatrix} = U(s) \begin{bmatrix} T_1(s) \\ T_2(s) \\ \vdots \\ T_n(s) \end{bmatrix} \quad (40)$$

Each matrix is rewritten as follows:

$$\dot{X}\dot{E} = u(s)\dot{T} \quad (41)$$

$$\dot{E} = \dot{X}^{-1} u(s)\dot{T}$$

Letting the cofactor of an element Xik of the matrix X be represented by Xik, it follows that $$\dot{X}^{-1} = \frac{[Xki]}{det\dot{X}} \quad (42)$$

Accordingly, the equation (41) becomes as follows:

$$\dot{E} = \frac{[Xki]}{det\dot{X}} \cdot u(s)\dot{T} \quad (43)$$

And, if $$\dot{F} = \frac{[Xki]}{det\dot{X}} \cdot \dot{T} \quad (44)$$

the equation (41) is expressed as follows:

$$\dot{E} = U(s) \cdot \dot{F} \quad (45)$$

Substituting the equation (45) into the equation (38), it follows that $$y(s) = u(s) + u(s)\Sigma Fi(s)(Ai - Bi)$$

Consequently, the transfer function T(s) of the circuit as a whole is given by $$T(s) = \frac{y(s)}{u(s)} = 1 + \Sigma Fi(s)(Ai - Bi) \quad (46)$$

Here, [Xki] in the equation (43) and detXn can be obtained as follows:

$$[Xki] = \quad (47)$$

$$\begin{bmatrix} (1 + \Sigma Bi \cdot Ti - B_1T_1) & -B_2T_1 & \cdots & -B_nT_1 \\ -B_1 \cdot T_2 & (1 + \Sigma B_iT_i - B_2T_2) & \cdots & -B_nT_2 \\ \vdots & \vdots & \ddots & \vdots \\ -B_1 \cdot T_n & -B_2 \cdot T_1 & \cdots & (1 + \Sigma B_iT_i - B_nT_n) \end{bmatrix}$$

$$det\dot{X}n = 1 + \sum_{i=1}^{n} BiTi(s) \quad (48)$$

Accordingly, the equation (44) becomes as follows:

$$F = \cfrac{1}{1 + \sum\limits_{i=1}^{n} BiTi(s)} \begin{bmatrix} (1 + \Sigma BiTi - B_1T_1) & -B_2T_1 & \cdots & -B_nT_1 \\ -B_1T_2 & (1 + \Sigma BiTi - B_2T_2) & \cdots & -B_nT_2 \\ \vdots & \vdots & \ddots & \vdots \\ -B_1T_n & -B_2T_n & & (1 + \Sigma BiTi - B_nT_n) \end{bmatrix} \quad (49)$$

$$\begin{bmatrix} T_1(s) \\ T_2(s) \\ \vdots \\ \vdots \\ T_n(s) \end{bmatrix} = \cfrac{1}{1 + \sum\limits_{i=1}^{n} BiTi(s)} \begin{bmatrix} T_1(s) \\ T_2(s) \\ \vdots \\ \vdots \\ T_n(s) \end{bmatrix}$$

Therefore, substituting the equation (49) into the equation (46), it follows that $$T(s) = 1 + \Sigma Fi(s)(Ai - Bi)$$

$$= 1 + \cfrac{\sum\limits_{i=1}^{n} Ti(Ai - Bi)}{1 + \sum\limits_{i=1}^{n} BiTi(s)}$$

$$= \cfrac{1 + \sum\limits_{i=1}^{n} AiTi(s)}{1 + \sum\limits_{i=1}^{n} BiTi(s)}$$

Now, if Ti(s) is considered to be the transfer function of the band-pass filter such as given by the equation (35), then it follows that $$T(s) = \cfrac{1 + \cfrac{A_1 \Delta\omega_1 S}{S^2 + \Delta\omega_1 S + \omega_1^2} + \ldots + \cfrac{A_n \Delta\omega_n S}{S^2 + \Delta\omega_n S + \omega_n^2}}{1 + \cfrac{B_1 \Delta\omega_1 S}{S^2 + \Delta\omega_1 S + \omega_1^2} + \ldots + \cfrac{B_n \Delta\omega_n S}{S^2 + \Delta\omega_n S + \omega_n^2}}$$

Normalizing the above equation with $S = (J\omega)/(\omega i)$ as described previously, it can be expressed as follows:

$$T(s) = \cfrac{1 + \cfrac{A_1 \cfrac{\Delta\omega_1}{\omega_1} S}{S^2 + \cfrac{\Delta\omega_1}{\omega_1} S + 1} + \ldots + \cfrac{A_n \cfrac{\Delta\omega_n}{\omega_n} S}{S^2 + \cfrac{\Delta\omega_n}{\omega_n} S + 1}}{1 + \cfrac{B_1 \cfrac{\Delta\omega_1}{\omega_1} S}{S^2 + \cfrac{\Delta\omega_1}{\omega_1} S + 1} + \ldots + \cfrac{B_n \cfrac{\Delta\omega_n}{\omega_n} S}{S^2 + \cfrac{\Delta\omega_n}{\omega_n} S + 1}}$$

The band-pass filter shown in FIG. 12 can be used as the band-pass filter 63 or 63-1, 63-2, . . . 63-n in FIG. 13 or 14. The filter circuit is not limited specifically to the band-pass filter of FIG. 12 and various other filter circuits can be employed in this invention.

Next, a description will be given of the formation of a frequency characteristic adjusting circuit having such a transfer function as given by the aforementioned equation (101), (102) or (3).

Figure 16:
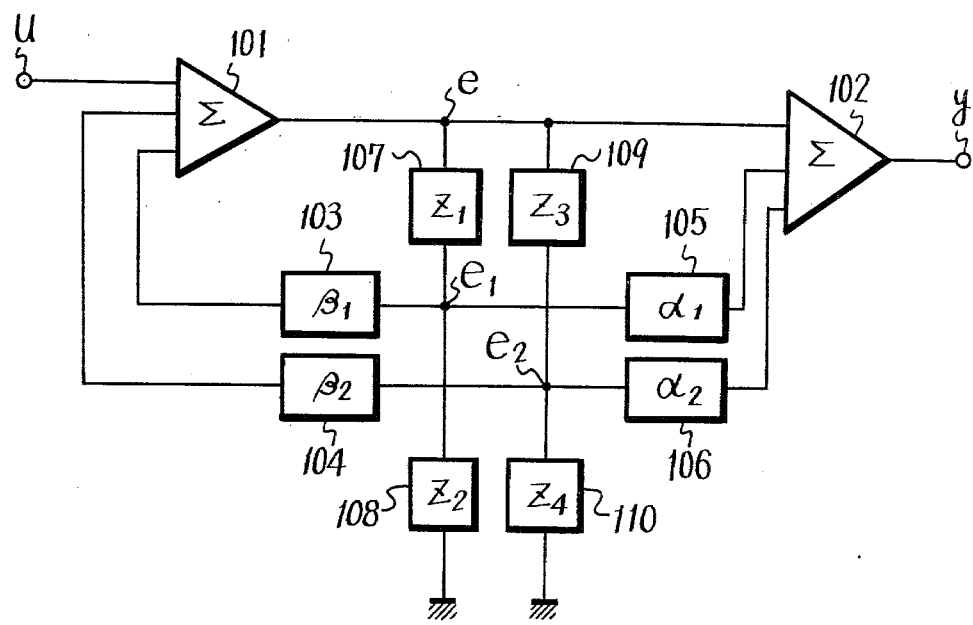
FIGS. 16 to 24, inclusive, are block diagrams showing other examples of the invention.

FIG. 16 illustrates an example of the basic circuit construction of the present invention. An input signal is applied to an adder 101, whose output is provided to an adder 102 and, at the same time, to a first voltage dividing circuit comprised of impedance circuits 107 and 108 and a second voltage dividing circuit comprised of impedance circuits 109 and 110. The voltage-divided output from the first voltage dividing circuit is supplied to each of amplifiers 103 and 105.

The output from the second voltage dividing circuit is similarly provided to each of amplifiers 104 and 106. The outputs from the amplifiers 103 and 104 are both fed back to the adder 101, and the outputs from the amplifiers 105 and 106 are both fed forward to the adder 102.

Figure 17:
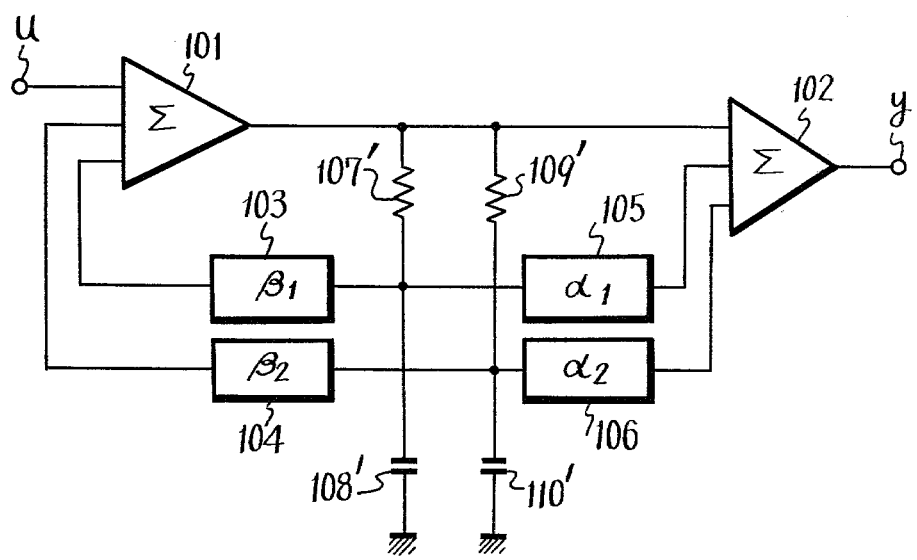

In FIG. 17 there is shown another example of the basic circuit arrangement of this invention which employs resistors 107' and 109' in place of the impedance circuits 107 and 109 and resistors 108' and 110' in place of the impedance circuits 108 and 110.

Figure 18:
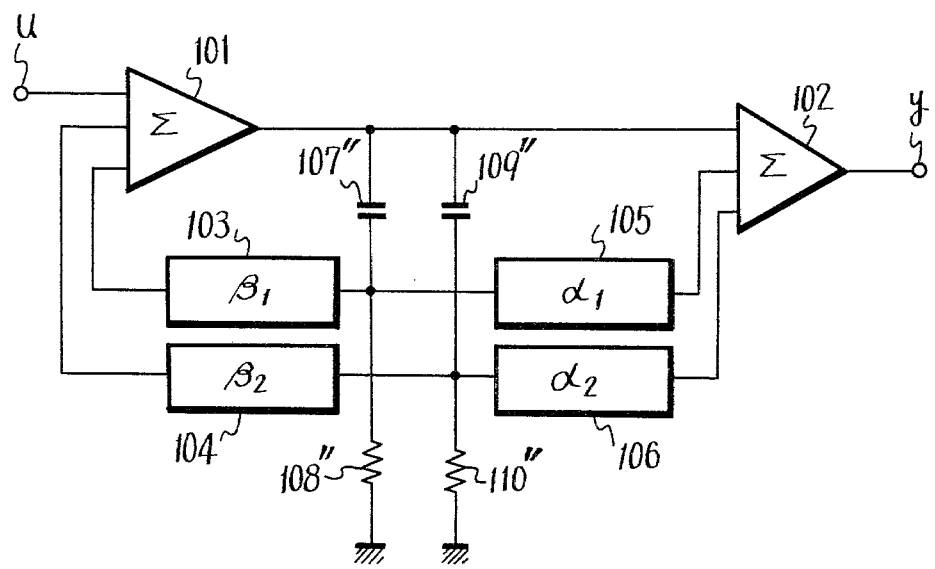

In FIG. 18 there is illustrated another example of the basic circuit arrangement which employs the capacitors 107" and 109" in place of the impedance circuits 107 and 109 and resistors 108" and 110" in place of the impedance circuits 108 and 110.

Letting the impedances of the impedance circuits 107, 108, 109 and 110 be represented by $Z_1$, $Z_2$, $Z_3$ and $Z_4$ respectively, the amplification degrees (transfer factors) of the amplifiers 103, 104, 105 and 106 be represented by $\beta_1$, $\beta_2$, $\alpha_1$ and $\alpha_2$ respectively, the input signal be represented by u, the output voltages from the adders 101 and 102 be represented by e and y respectively and the voltage-divided outputs from the first and second voltage dividing circuits be represented by $e_1$ and $e_2$ respectively, it follows that $$e_1 = e \cfrac{Z_2}{Z_1 + Z_2} \quad (104)$$

$$e_2 = e \cfrac{Z_4}{Z_3 + Z_4} \quad (105)$$

and, further, it follows that $$e = u + \beta_1 e_1 + \beta_2 e_2 \quad (106)$$

$$y = e + \alpha_1 e_1 + \alpha_2 e_2 \quad (107)$$

Substituting them with the following equations, $$\cfrac{Z_2}{Z_1 + Z_2} = T_1(s) \quad (108)$$

$$\cfrac{Z_4}{Z_3 + Z_4} = T_2(s) \quad (109)$$

the equations (104) and (105) become as follows:

$$e_1 = eT_1(s) \tag{110}$$

$$e_2 = eT_2(S) \tag{111}$$

Substituting the equations (110) and (111) into the equation (106), it follows that $$e = u + \beta_1 eT_1(S) + \beta_2 eT_2(S)$$

$$u = e\{1 - \beta_1 T_1(S) - \beta_2 T_2(S)\}$$

Substituting the equations (110) and (111) into the equation (107), it follows that $$y = e\{1 + \alpha_1 T_1(S) + \alpha_2 T_2(S)\}$$

Accordingly, the transfer function T(s) of the frequency characteristic adjusting circuit in which the input signal is represented by u and the output from the adder 102 is represented by y becomes as follows:

$$T(S) = \frac{y}{u} \tag{112}$$

$$= \frac{1 + \alpha_1 T_1(S) + \alpha_2 T_2(S)}{1 - \beta_1 T_1(S) - \beta_2 T_2(S)}$$

(i) Now, consider the case in which $$\frac{Z_1}{Z_2} = a_1 S \tag{113}$$

$$\frac{Z_3}{Z_4} = a_2 S \tag{114}$$

The above case occurs, for example, when $Z_1$ and $Z_3$ are resistors and $Z_2$ and $Z_4$ are capacitors. That is, in this case, the embodiment of FIG. 17 can be applied.

In this case, it follows from the equations (108) and (109) that $$T_1(S) = \frac{1}{a_1 S + 1}$$

$$T_2(S) = \frac{1}{a_2 S + 1}$$

Accordingly, substituting the above into the equation (112) and rearranging it, it follows that $$T(S) = \frac{1 + \frac{\alpha_1}{a_1 S + 1} + \frac{\alpha_2}{a_2 S + 1}}{1 - \frac{\beta_1}{a_1 S + 1} - \frac{\beta_2}{a_2 S + 1}} \tag{112'}$$

Now, if $$a_1 = \frac{2\omega}{\omega_0}, \; a_2 = \frac{1}{2\omega_0}$$

and $\beta_1 = -\beta_2 = \beta$, it follows that $$T(s) = \tag{115}$$

$$\frac{S^2 + \left\{2(1+\alpha_2) + \frac{1+\alpha_1}{2}\right\}\omega_0 S + (1 + \alpha_1 + \alpha_2)\omega_0^2}{S^2 + \frac{5+3\beta}{2}\omega_0 S + \omega_0^2}$$

In the case of normalizing the center frequency, the abovesaid amplification degrees are selected such that $a_1=2$, $a_2=\frac{1}{2}$ and $\beta_1=-\beta_2=\beta$, and in this case, the equation (112') can be expressed by $$T(s) = \frac{S^2 + \left\{2(1+\alpha_2) + \frac{1+\alpha_1}{2}\right\}S + (1 + \alpha_1 + \alpha_2)}{S^2 + \frac{5+3\beta}{2}S + 1} \tag{115'}$$

(ii) Next, consider the case in which $$\frac{Z_1}{Z_2} = \frac{1}{a_1 S} \tag{113'}$$

$$\frac{Z_3}{Z_4} = \frac{1}{a_2 S} \tag{114'}$$

This occurs, for example, in the case where $Z_1$ and $Z_3$ are capacitors and $Z_2$ and $Z_4$ are resistors. That is, in this case, it follows from the equations (108) and (109)

$$T_1(S) = \frac{1}{\frac{1}{a_1 S} + 1}$$

$$T_2(S) = \frac{1}{\frac{1}{a_2 S} + 1}$$

Accordingly, substituting this into the equation (112), it follows that $$T(s) = \frac{a_1 a_2(1+\alpha_1+\alpha_2)S^2 + (a_2+a_1+\alpha_1 a_1+\alpha_2 a_2)S + 1}{a_1 a_2(1-\beta_1-\beta_2)S^2 + (a_2+a_1-\beta_1 a_1-\beta_2 a_2)S + 1} \tag{112''}$$

Now, if (the abovementioned amplification degrees are) selected such that $$a_1 = \frac{2}{\omega_0}, \; a_2 = \frac{1}{2\omega_0}$$

and $\beta_1=-\beta_2=\beta$, it follows that $$T(S) = (1+\alpha_1+\alpha_2)\frac{S^2 + \frac{2(1+\alpha_1) + \frac{1}{2}(1+\alpha_2)}{1+\alpha_1+\alpha_2}\omega_0 S + \frac{\omega_0^2}{1+\alpha_1+\alpha_2}}{S^2 + \frac{5-3\beta}{2}\omega_0 S + \omega_0^2} \tag{115'}$$

Therefore,

-continued $$T(S) = \frac{T(S)}{1 + \alpha_1 + \alpha_2} = \frac{S^2 + \frac{2(1 + \alpha_1) + \frac{1}{2}(1 + \alpha_2)}{1 + \alpha_1 + \alpha_2}\omega_0 S + \frac{\omega_0^2}{1 + \alpha_1 + \alpha}}{S^2 + \frac{5 - 3\beta}{2}\omega_0 S + \omega_0^2} \quad (115'')$$

In the case of normalizing the center frequency, if $$a_1 = 2, a_2 = \tfrac{1}{2}$$

and $\beta_1 = -\beta_2 = \beta$, and in this case, it follows that $$T(S) = \frac{S^2 + \frac{2(1 + \alpha_1) + \frac{1}{2}(1 + \alpha_2)}{1 + \alpha_1 + \alpha_2} S + \frac{1}{1 + \alpha_1 + \alpha_2}}{S^2 + \frac{5 - 3\beta}{2} S + 1} \quad (115''')$$

(i-1) Now, consider the case of achieving the transfer function of the equation (101) using the circuit of FIG. 17 in the abovesaid case (i). The conditions on which the equations (101) and (115) become equal to each other are as follows:

$$1 + \alpha_1 + \alpha_2 = K^2 \quad (116)$$

$$2(1 + \alpha_2) + \frac{1 + \alpha_1}{2} = K(1 + A)\frac{\Delta\omega}{\omega_0} \quad (117)$$

$$\frac{5 + 3\beta}{2} = (1 + \beta)\frac{\Delta\omega}{\omega_0} \quad (118)$$

Accordingly, from the equations (116), (117) and (118), $\alpha_1$, $\alpha_2$ and $\beta$ become as follows:

$$\alpha_1 = -\frac{2K(1 + A)\Delta\omega}{3\omega_0} + \frac{4K^2 + 1}{3} \quad (119)$$

$$\alpha_1 = \frac{2K(1 + A)\Delta\omega}{3\omega_0} - \frac{K^2 + 4}{3} \quad (120)$$

$$\beta_1 = -\beta_2 = \beta = \frac{2(1 + B)\Delta\omega}{3\omega_0} - \frac{5}{3} \quad (121)$$

Consequently, in the above case (i-1), the purpose can be attained by using the equations (119), (120) and (121) for obtaining the amplification degrees $\beta_1$, $\beta_2$, $\alpha_1$ and $\alpha_2$ of the amplifiers 103, 104, 105 and 106 in the basic circuit arrangement of FIG. 17.

In this case, since $$a_1 = \frac{2}{\omega_0} \text{ and } a_2 = \frac{1}{2\omega_0}$$

in the equations (113) and (114), letting the resistance values of the resistors 107' and 109' be represented by $R_1$ and $R_2$ and the capacitance values of the capacitors 108' and 110' be represented by $C_1$ and $C_2$, they bear the following relationships:

$$C_1 R_1 = \frac{2}{\omega_0} \quad (122')$$

$$C_2 R_2 = \frac{1}{2\omega_0} \quad (123)$$

Figure 22:
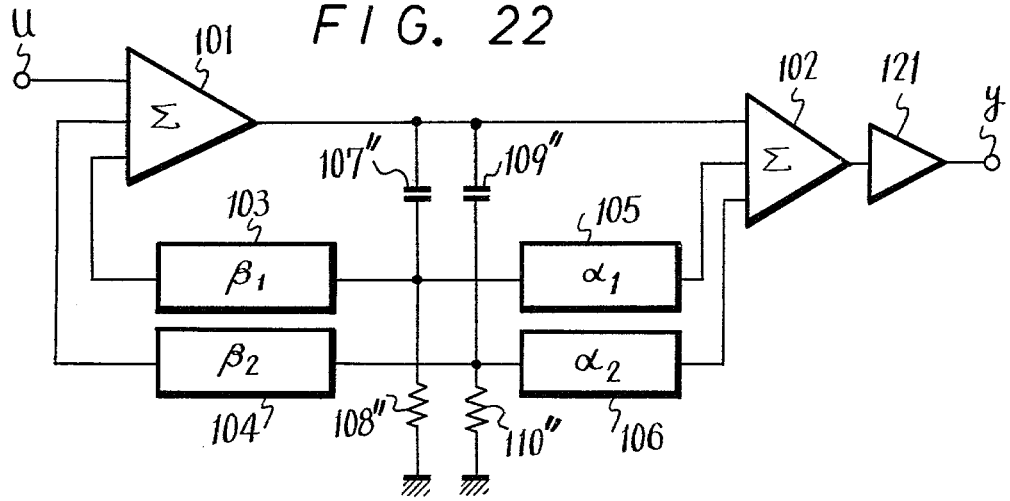

(ii-1) Next, consider the case of achieving the transfer function of the equation (101) using the basic circuit arrangement of FIG. 22 in connection with the abovesaid case (ii).

In this case, the equations (101) and (115') cannot be made equal to each other; but the right sides of the equations (101) and (105'') can be made equal, and the conditions therefore are as follows:

$$\frac{1}{1 + \alpha_1 + \alpha_2} = K^2 \quad (128)$$

$$\frac{2(1 + \alpha_1) + \frac{1}{2}(1 + \alpha_2)}{1 + \alpha_1 + \alpha_2} K(1 + A)\frac{\Delta\omega}{\omega_0} \quad (129)$$

$$\frac{5 - 3\beta}{2} = (1 + B)\frac{\Delta\omega}{\omega_0} \quad (130)$$

Accordingly, from the equations (128), (129) and (130), $\alpha_1$, $\alpha_2$ and $\beta$ are derived as follows:

$$\alpha_1 = \frac{2(1 + A)\Delta\omega}{3K\omega_0} - \frac{1}{3K^2} - \frac{4}{3} \quad (131)$$

$$\alpha_2 = -\frac{2(1 + A)\Delta\omega}{3K\omega_0} + \frac{4}{3K^2} + \tfrac{1}{3} \quad (132)$$

$$\beta = -\frac{2(1 + B)\Delta\omega}{3\omega_0} + \frac{5}{3} \quad (133)$$

By applying the thus obtained amplification degrees to the amplifiers 103, 104, 105 and 106 in the basic circuit arrangement of FIG. 18, it is possible to obtain a transfer function that the transfer function T(s) of the equation (101) is multiplied by $(1 + \alpha_1 + \alpha_2)$. As a consequence, by connecting an amplifier having an amplification degree, $$\frac{1}{1 + \alpha_1 + \alpha_2} = K^2,$$

to the stage following the basic circuit arrangement of FIG. 18, a circuit can be obtained which has the transfer function T(s) given by the equation (101).

FIG. 22 shows, by way of example, a basic circuit construction which can be employed in such a case and in which an amplifier 121 is further connected to the output terminal of the adder 102. Consequently, in the case (ii-1), the amplification degree of the amplifier 121 is selected to be $K^2$, as described above. In this instance, letting the resistance values of the resistors 108'' and 110'' be represented by $R_1$ and $R_2$ and the capacitance vlues of the capacitors 107'' and 109'' be represented by $C_1$ and $C_2$, they bear the relationships given by the equations (122) and (123) since $$a_1 = \frac{2}{\omega_0} \text{ and } a_2 = \frac{1}{2\omega_0}$$

in the equations (113') and (114').

In the foregoing embodiments, the resonance frequency can be made variable by making the resistors or capacitors of the first and second voltage dividing circuits variable in ganged relation; in this case, they are varied, with the relationships of the equations (123) and (124) retained.

Figure 19:
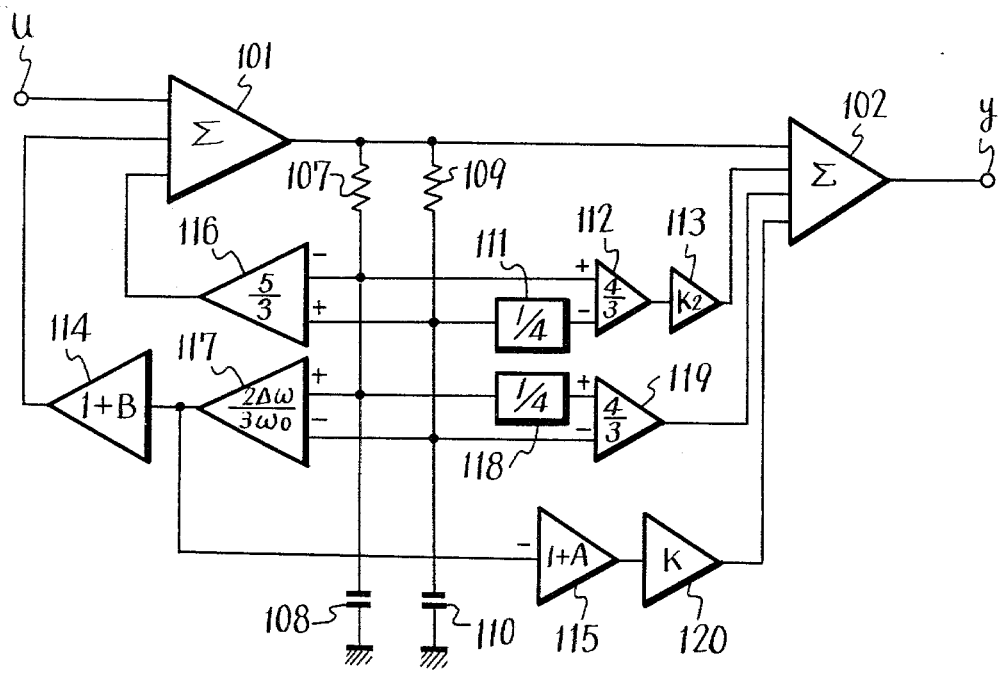

FIG. 19 illustrates a circuit arrangement in which the terms of the amplification degrees of the amplifiers 103, 104, 105 and 106 for the feedback and the feed-forward use in FIG. 17 in the abovesaid case (i-1) are rearranged. In FIG. 19, parts having the same functions as in FIG. 17 in the case (i-1) are identified by the same reference numerals, and no description will be repeated.

In FIG. 19, the output from the first voltage dividing circuit is branched into four; namely, one is attenuated by an attenuator 118 down to ¼ and applied to a non-inverting terminal of a differential amplifier 119, another is provided to an inverting terminal of a differential amplifier 116 and the others are supplied to non-inverting terminals of differential amplifiers 112 and 117 respectively. The output from the second voltage dividing circuit is also likewise branched into four, one being applied to an inverting terminal of the differential amplifier 112 after being attenuated by an attenuator 111 down to ¼, another being provided to a non-inverting terminal of the differential amplifier 116 and the others being fed to inverting terminals of the differential amplifiers 117 and 119 respectively.

The outputs from the differential amplifiers 116 and 119 are applied to the adders 101 and 102 respectively; the output from the differential amplifier 112 is applied via an amplifier 113 to the adder 102; and the output from the differential amplifier 117 is applied via an amplifier 114 to the adder 101 and via amplifiers 115 and 120 to the adder 102.

The amplification degrees of the amplifiers 113, 114, 115 and 120 are selected to be $K^2$, $1+B$, $-(1+A)$ and $K$ respectively, and the amplification degrees of the differential amplifiers 112, 116, 117 and 119 are selected to be 4/3, 5/3, $2\Delta\omega/3\omega_0$ and 4/3 respectively.

The frequency characteristic adjusting circuit of the above construction is basically identical with the circuit of FIG. 17; but, for example, in FIG. 17, the coefficient $\Delta\omega/\omega_0$ is included in the amplification degree of each of the amplifiers 103, 104, 105 and 106, and in the embodiment of FIG. 19, the coefficient is included in the amplification degree of the differential amplifier 117 alone. Accordingly, the coefficient $\Delta\omega/\omega_0$ can be varied by changing the amplification degree of the differential amplifier 117. Since the coefficient $\Delta\omega/\omega_0$ is a reciprocal of Q representing the sharpness of the filter circuit, Q can be made variable independently.

As for $1+A$ and $(1)/(1+B)$ representing the amplification degree at the resonance point of the filter characteristic, $1+A$ and $1+B$ are included only in the amplifiers 115 and 114, so that by making the amplification degrees of the amplifiers 115 and 114 variable, the amplification or attenuation degree at the resonance point can be varied independently. Also, K representing the amplification (or attenuation) in the low-frequency range degree is included only in the amplifiers 113 and 120, so that by making the amplification degrees of the amplifiers 113 and 120 variable in ganged relation, the amplification (attenuation) degree in the low-frequency range can be made variable.

As described above, with the embodiment of FIG. 19, the amplification (or attenuation) degree at the resonance point, the amplification (or attenuation) degree in the low-frequency range and Q can easily be made variable independently. Accordingly, the frequency characteristic can easily be adjusted to a desired characteristic.

In the case of fixing the characteristic of such a frequency characteristic adjusting circuit, since the transfer function of each amplifier is a constant value, the circuit can be made very simple in construction.

Each impedance of the voltage dividing circuits need not always be limited specifically to a resistor or capacitor but may also be an inductance. In this case, for example, if resistors are used as $Z_1$ and $Z_3$ and if inductances are used as $Z_2$ and $Z_4$, then the other circuit components are such as shown in FIG. 22 in the case (ii-1). If inductances are used as $Z_1$ and $Z_3$ and if resistors are used as $Z_2$ and $Z_4$, the other circuit components are such as shown in FIG. 17 in the case (i-1).

Figure 15A:
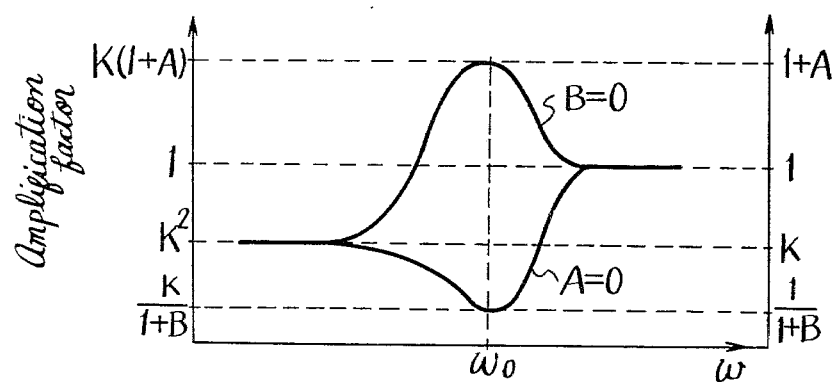
FIGS. 15A, 15B and 15C are respectively graphs used for explaining the invention.
Figure 15B:
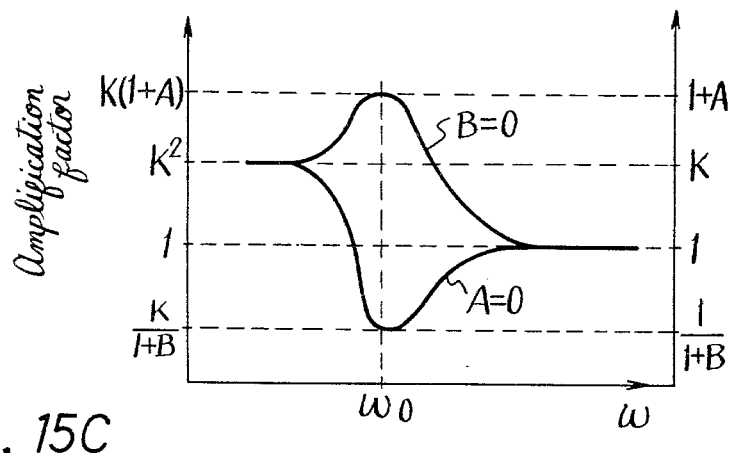
Figure 15C:
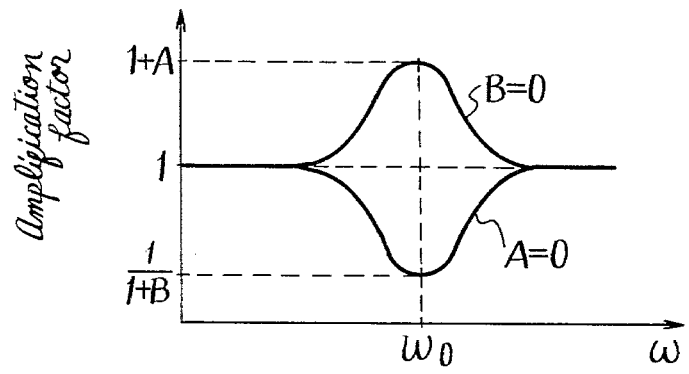

In the above, K is described to be selected as desired, but in the case of fixing K to 1, the equation (101) becomes $$T(s) = \frac{S^2 + (1 + A)\Delta\omega S + \omega_0^2}{S^2 + (1 + B)\Delta\omega S + \omega_0^2} \quad (101'')$$

resulting in such a characteristic as shown in FIG. 15 (c).

In such a case, K is selected to be 1 in the embodiments of (i-1), (ii-1) and FIG. 19.

Figure 20:
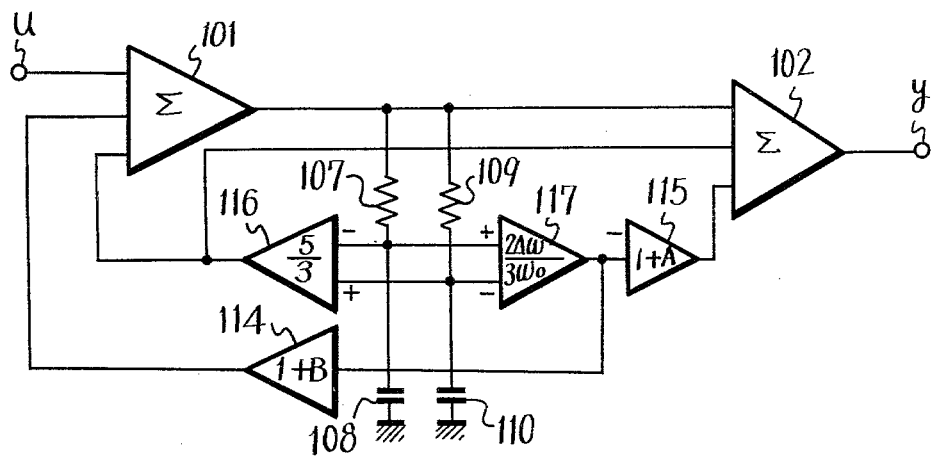

Accordingly, by selecting K to be 1 and rearranging the terms of the transfer factors of the amplifiers 103, 104, 105 and 106 in the embodiment (i-1), such an embodiment as shown in FIG. 20 can be obtained.

In FIG. 20, the parts having the same functions as in FIG. 19 are identified by the same reference numerals, and no description will be repeated. In this embodiment, the output from the amplifier 116 is provided to both of the adders 101 and 102.

Figure 21:
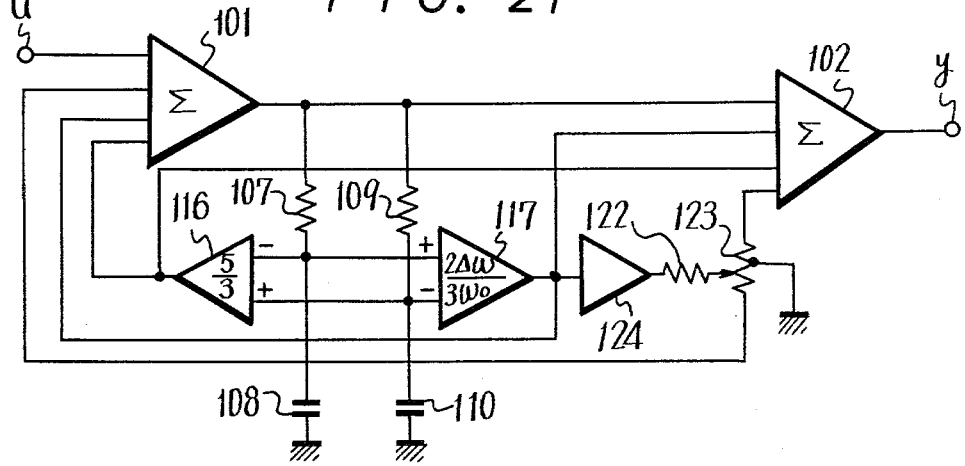

FIG. 21 illustrates a modified form of the embodiment of FIG. 20 in which the coefficients A and B in the amplification degrees of the amplifiers 114 and 115 are made variable in ganged relation. In FIG. 21, the parts common to those in FIG. 20 are marked with the same reference numerals and no description will be repeated. In FIG. 21, the output from the differential amplifier 117 is branched into three, one of which is connected to a movable contact of a variable resistor 123 via an amplifier 124 having a suitable amplification degree and a resistor 122. The variable resistor 123 is connected at both ends to an add terminal of the adder 101 and a subtract terminal of the adder 102 respectively and grounded at the mid point.

With the above arrangement, the coefficient A or B can be made variable by the voltage dividing ratio dependent on the set resistance values of the resistor 122 and the variable resistor 123.

In the foregoing, the amplifiers and the differential amplifiers include not only those of amplification degree larger than 1 but also those of amplification degree less than 1.

In the foregoing, if the adders 101 and 102 are each formed by one differential amplifier, then there are obtained positive and negative adding coefficients respectively corresponding to non-inverting and inverting terminal of the differential amplifier; furthermore, if such an arrangement is made that pluralities of signals to be added together are applied to the respective terminals via input resistors of different resistance values, then different adding coefficients can be obtained.

Accordingly, for example, in the case of employing adders having such positive and negative adding coefficients as described above, the differential amplifiers in the embodiment of FIG. 19 need not always be provided independently, as shown; and they can be omitted by performing the subtracting operation of the differential amplifiers using the adders. (i-2) Next, a description will be given of the case where the transfer function of the equation (102) is obtained with the basic circuit of FIG. 17 in connection with the case (i) described previously.

The conditions for making the equations (102) and (115) identical with each other are as follows:

$$1 + \alpha_1 + \alpha_2 = K \qquad (134)$$

$$2(1 + \alpha_2) + \frac{1 + \alpha_1}{2} = (1 + A)\frac{\Delta\omega}{\omega_0} \qquad (135)$$

$$\frac{5 + 3\beta}{2} = (1 + B)\frac{\Delta\omega}{\omega_0} \qquad (136)$$

Accordingly, from the equations (134), (135) and (136), $\alpha_1$, $\alpha_2$ and $\beta$ becomes as follows:

$$\alpha_1 = -\frac{2(1 + A)\Delta\omega}{3\omega_0} + \frac{4K + 1}{3} \qquad (137)$$

$$\alpha_2 = \frac{2(1 + A)\Delta\omega}{3\omega_0} - \frac{K + 4}{3} \qquad (138)$$

$$\beta_1 = -\beta_2 = \beta = \frac{2(1 + B)\Delta\omega}{3\omega_0} - \frac{5}{3} \qquad (139)$$

Consequently, in the basic circuit arrangement of FIG. 17, the transfer function of the equation (102) can be obtained by setting the amplification degrees $\beta_1$, $\beta_2$, $\alpha_1$ and $\alpha_2$ of the amplifiers 103, 104, 105 and 106 to the values given by the equations (137), (138) and (139).

Here, the resistance values of the resistors 107' and 109' are represented by $R_1$ and $R_2$, and the capacitance values of the capacitors 108 and 110 are represented by $C_1$ and $C_2$. In this case, since $$a_1 = \frac{2}{\omega_0} \text{ and } a_2 = \frac{1}{2\omega_0}$$

in the equations (113) and (114), the abovesaid resistance and capacitance values bear the following relationships:

$$C_1 R_1 = \frac{2}{\omega_0} \qquad (140)$$

$$C_2 R_2 = \frac{1}{2\omega_0} \qquad (141)$$

(ii-2) Next, a description will be made of the case where the transfer function of the equation (102) is obtained with the circuit of FIG. 22 in connection with the abovesaid case (ii).

The equations (102) and (115') cannot be made identical with each other, but their right sides can be made identical, and the conditions therefor are as follows:

$$\frac{1}{1 + \alpha_1 + \alpha_2} = K \qquad (142)$$

$$\frac{2(1 + \alpha_1) + \frac{1}{2}(1 + \alpha_2)}{1 + \alpha_1 + \alpha_2} = (1 + A)\frac{\Delta\omega}{\omega_0} \qquad (143)$$

$$\frac{5 - 3\beta}{2} = (1 + \beta)\frac{\Delta\omega}{\omega_0} \qquad (144)$$

Accordingly, the amplification degrees $\alpha_1$, $\alpha_2$ and $\beta$ are derived from the equations (142), (143) and (144) as follows:

$$\alpha_1 = \frac{2(1 + A)\Delta\omega}{3K\omega_0} - \frac{1}{3K} - \frac{4}{3} \qquad (145)$$

$$\alpha_2 = \frac{2(1 + A)\Delta\omega}{3K\omega_0} + \frac{4}{3K} + \frac{1}{3} \qquad (146)$$

$$\beta = -\frac{2(1 + B)\Delta\omega}{3\omega_0} + \frac{5}{3} \qquad (147)$$

When applying the amplification degrees thus obtained to the amplifiers 103, 104, 105 and 106 in the basic circuit of FIG. 18, it is possible to obtain the transfer function that the transfer function T(s) given by the equation (102) is multiplied by $(1+\alpha_1+\alpha_2)$.

Accordingly, by connecting a circuit having an amplification degree, $$\frac{1}{1 + \alpha_1 + \alpha_2} = K,$$

to the stage following the basic circuit of FIG. 18, there can be constituted a circuit having the transfer function T(s) of the equation (102). This can be achieved by selecting the amplification degree of the amplifier 121 to be K in FIG. 22. The resistors 108 and 110 are set to have the resistance values $R_1$ and $R_2$ respectively, and the capacitors 107 and 109 are set to have the capacitance values $C_1$ and $C_2$ respectively. In this case, $$a_1 = \frac{2}{\omega_0} \text{ and } a_2 = \frac{1}{2\omega_0}$$

in the equatios (113') and (114'), so that the resistance and capacitance values bear the relationships given by the aforesaid equations (122) and (123).

In the above, in the case of making the resonance frequency variable, the resistors or the capacitors of the first and second voltage dividing circuits are made variable in ganged relation with the relationships of the equations (122) and (123) maintained.

Figure 23:
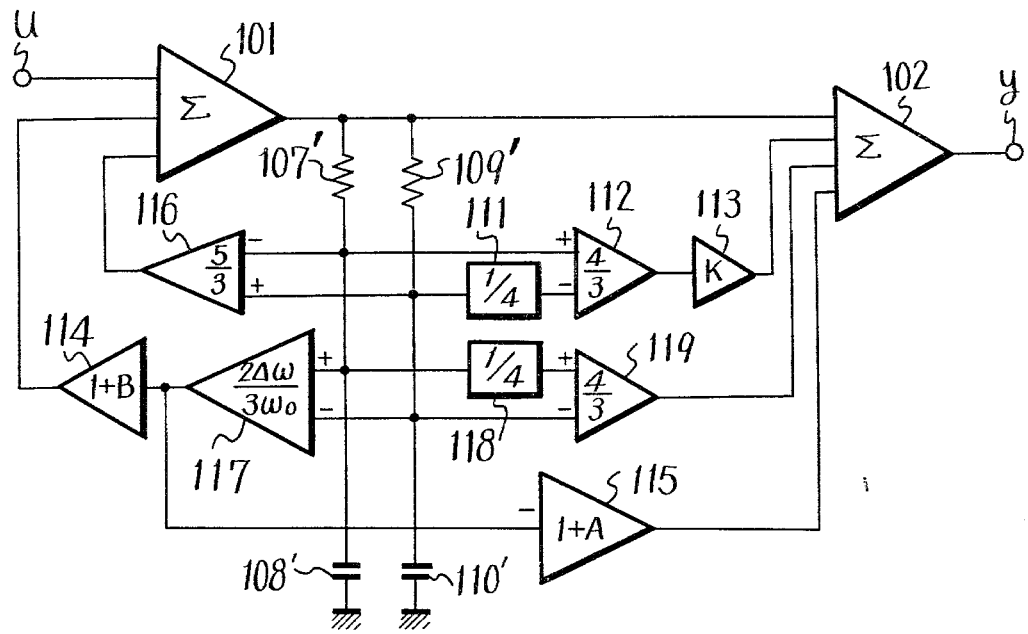

FIG. 23 illustrates a circuit arrangement in which the terms of the amplifiers 103, 104, 105 and 106 for feedback and feedforward use in the circuit of FIG. 17 in the case (i-2) are rearranged. In FIG. 23, the parts having the same functions as those in FIGS. 17 and 19 are marked with the same reference numerals, and no description will be repeated with respect to them.

In FIG. 23, the output from the first voltage dividing circuit is branched into four, one being attenuated by the attenuator 118 down to ¼ and then provided to the non-inverting terminal of the differential amplifier 119, another output being applied to the inverting terminal of the differential amplifier 116 and the other remaining outputs being provided to the non-inverting terminals of the differential amplifiers 112 and 117 respectively. The output from the second voltage dividing circuit is also branched into four; one output is applied to the inverting terminal of the differential amplifier 112 after being attenuated by the attenuator 111 down to ¼, another output is supplied to the non-inverting terminal of the differential amplifier 116, and the other remaining outputs are fed to the inverting terminals of the differential amplifiers 117 and 119 respectively. The outputs from the differential amplifiers 116 and 119 are respectively provided to the adders 101 and 102; the output from the differential amplifier 112 is applied via the amplifier 113 to the adder 102; and the output from the differential amplifier 117 is branched into two, one being supplied via the amplifier 114 to the adder 101 and the other being applied via the inverting amplifier 115 to the adder 102.

The amplification degrees of the amplifiers 113, 114 and 115 are selected to be K, (1+B) and −(1+A) respectively. The amplification degrees of the differential amplifiers 112, 116, 117 and 119 are selected to be 4/3, 5/3, $2\Delta\omega/2\omega_0$ and 4/3 respectively.

The frequency characteristics adjusting circuit of the above construction is identical basically with the circuit arrangement of FIG. 17 in the case (i-2); but, in FIG. 17 the coefficient $\Delta\omega/\omega_0$ is included in each of the transfer factors of the amplifiers 103, 104, 105 and 106, whereas in the embodiment of FIG. 23, such a coefficient is included in the amplification degree of the differential amplifier 117 alone.

Consequently, the coefficient $\Delta\omega/\omega_0$ can be made variable by changing the amplification degree of the differential amplifier 117. Since the coefficient $\Delta\omega/\omega_0$ is the reciprocal of Q representing the sharpness of the filter circuit, Q can be made variable independently in the end.

Also in connection with the amplification degrees 1+A and 1/1+B at the resonance point of the filter characteristic, 1+A and 1+B are respectively included in the amplification degrees of the amplifiers 115 and 114 only, so that the amplification or attenuation degree at the resonance point can be varied independently by making the amplification degrees of the amplifiers 115 and 114 variable. Further, since the coefficient K representing the amplification (or attenuation) degree in the low-frequency range is included in the amplification degree of the amplifier 113 alone, the amplification (attenuation) degree in the low-frequency range can be varied by making the amplification degree of the amplifier 113 variable.

As described above, with the embodiment of FIG. 23, the amplification (or attenuation) degree at the resonance point, the amplification (or attenuation) degree in the low-frequency range and Q can easily be varied independently.

As a consequence, the frequency characteristic can readily be adjusted to a desired one.

In the case where such adjustment of the frequency characteristic as described above is not needed, the circuit arrangement can be made very simple since the transfer factor of each amplifier in FIG. 16 is constant. Each impedance in the voltage dividing circuits need not always be limited specifically to a resistor or capacitor but may also be an inductance. For example, in the case of the embodiment of FIG. 22, the capacitors 107″ and 109″ are replaced with resistors, and the resistors 108″ and 110″ are replaced with inductances. In the case of the embodiment of FIG. 17, inductances are employed in the place of the resistors 107′ and 109′, and resistors are used in place of the capacitors 108′ and 110′.

In the above, the adding coefficients of the adders are described to be 1 but may be made different, and further, some of the coefficients of each adder may also be negative. As such an adder, use can be made of a differential amplifier which has, for example, a negative feedback resistor and whose differential input terminals have connected thereto input resistors of different resistance values.

Accordingly, if such an adder is employed, then the differential amplifiers, for example, in FIG. 23 need not be provided independently of the adders 101 and 102; and by applying the output from each voltage dividing circuit directly to the input terminals of each adder having positive and negative adding coefficients, the differential amplifiers in FIG. 23 can be dispensed with.

Next, a description will be given in respect of the case (i-3) of obtaining the transfer function of the equation (3) by using the basic circuit of FIG. 17 in the case (i).

As described previously with regard to the case (i), the equation (112′) is obtained. Setting $\alpha_1=-\alpha_2=\alpha$, $\beta_1=-\beta_2=\beta$, $a_1=2/\omega_0$ and $a_2=\frac{1}{2}\omega_0$, the equation (112′) becomes as follows:

$$T(s) = \frac{S^2 + \frac{5-3\alpha}{2}\omega_0 S + \omega_0^2}{S^2 + \frac{5+3\beta}{2}\omega_0 S + \omega_0^2} \quad (148)$$

In the case of normalizing the center frequency, it is sufficient to set $\alpha_1=-\alpha_2=\alpha$, $\beta_1=-\beta_2=\beta$, $a_1=2$ and $a_2=\frac{1}{2}$ in the equation (112′), and in this case, the equation (112′) becomes as follows:

$$T(s) = \frac{S^2 + \frac{5-3\alpha}{2} S + 1}{S^2 + \frac{5+3\beta}{2} S + 1} \quad (148')$$

Accordingly, the conditions for rendering the equations (3) and (148) identical with each other are as follows:

$$\frac{5-3\alpha}{2} = -\frac{2a}{\omega_0} \quad (149)$$

$$\frac{5+3\beta}{2} = \frac{2a}{\omega_0} \quad (150)$$

Consequently, $\alpha$ and $\beta$ are obtained from the equations (149) and (150) as follows:

$$\alpha = \alpha_1 = -\alpha_2 = \frac{5}{3} + \frac{4a}{3\omega_0} \quad (151)$$

$$\beta = \beta_1 = -\beta_2 = \frac{4a}{3\omega_0} \frac{5}{3} \quad (152)$$

Therefore, in the basic circuit of FIG. 17, it will suffice to set the amplification degrees $\beta_1, \beta_2, \alpha_1$ and $\alpha_2$ for the amplifiers 103, 104, 105 and 106 and to use the equations (151) and (152).

In this instance, the resistors 107′ and 109′ are given the resistance values $R_1$ and $R_2$ respectively, and the capacitors 109′ and 110′ are given the capacitance values $C_1$ and $C_2$ respectively.

In this case $a_1=2/\omega_0$ and $a_2=\frac{1}{2}\omega_0$ in the equations (113) and (114), so that these resistance and capacitance values have the following relationships:

$$C_1 R_1 = \frac{2}{\omega_0} \quad (153)$$

$$C_2 R = \frac{1}{2\omega_0} \quad (154)$$

Next, a description will be given with regard to the case (ii-3) of obtaining the transfer function of the equation (3) by using the basic circuit of FIG. 18 in the abovesaid case (ii). As already described in connection with the case (ii), the equation (112″) is obtained. Setting $\alpha_1 = -\alpha_2 = \alpha$, $\beta_1 = -\beta_2 = \beta$, $a_1 = 2/\omega_0$ and $a_2 = \frac{1}{2}\omega_0$, it follows that $$T(s) = \frac{S^2 + \frac{5 + 3\alpha}{2}\omega_0 S + \omega_0^2}{S^2 + \frac{5 - 3\beta}{2}\omega_0 S + \omega_0^2} \quad (155)$$

In the case of normalizing the center frequency, it will suffice to set $\alpha_1 = -\alpha_2 = \alpha$, $\beta_1 = -\beta_2 = \beta$, $a_1 = 2$ and $a_2 = \frac{1}{2}$ in the equation (112″), and in this case, the equation (112″) becomes as follows:

$$T(s) = \frac{S^2 + \frac{5 + 3\alpha}{2} S + 1}{S^2 + \frac{5 - 3\beta}{2} S + 1} \quad (155')$$

Accordingly, the condition on which the equations (103) and (155) becomes equal to each other are as follows:

$$\frac{5 + 3\alpha}{2} = -\frac{2a}{\omega_0} \quad (156)$$

$$\frac{5 - 3\beta}{2} = \frac{2a}{\omega_0} \quad (157)$$

Therefore, $\alpha$ and $\beta$ are obtained from the equations (156) and (157) as follows:

$$\alpha = -\frac{4a}{3\omega_0} - \frac{5}{3} \quad (158)$$

$$\beta = \frac{5}{3} - \frac{4a}{3\omega_0} \quad (159)$$

Consequently, in the basic circuit of FIG. 18, it will suffice to use the equations (158) and (119), with the amplification degrees $\beta_1$, $\beta_2$, $\alpha_1$ and $\alpha_2$ of the amplifiers 103, 104, 105 and 106.

As described above, $\alpha = -\beta_2$ and $\beta_1 = -\beta_2$ in the basic circuit of FIG. 18; therefore, it is possible to supply the adders 101 and 102 with an output proportional to a difference between the outputs from the first and second voltage dividing circuits.

In this case, the resistors 107 and 109 are given the resistance values $R_1$ and $R_2$ respectively, and the capacitors 108 and 110 are given the capacitance values $C_1$ and $C_2$ respectively.

Also in this case, $a_1 = 2/\omega_0$ and $a_2 = \frac{1}{2}\omega_0$ in the equations (113′) and (114′), so that these resistance and capacitance values bear the relationships defined by the aforesaid equations (122) and (123).

In the above embodiment, the center frequency can be made variable by making for example, the resistors or capacitors of the first and second voltage dividing circuits variable in ganged relation, with the relationships of the equations (122) and (123) retained.

Figure 24:
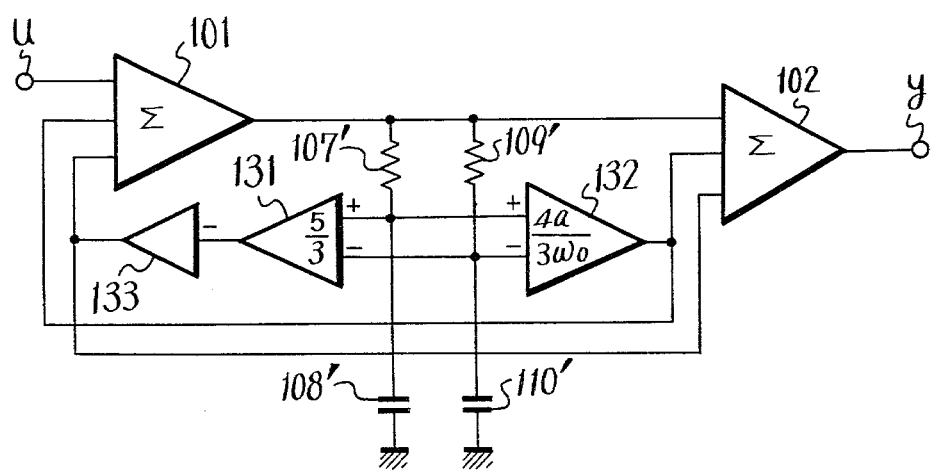

FIG. 24 illustrates a circuit arrangement in which there are rearranged the terms of the amplification degrees of the amplifiers 103, 104, 105 and 106 for feedback and feed-forward use in the basic circuit of FIG. 17 in the aforementioned case (i-3). In FIG. 24, the parts corresponding to those in FIG. 17 are identified by the same reference numerals, and no description will be given of them.

In FIG. 24, the output of the first voltage dividing circuit is branched into two, which are respectively connected to non-inverting terminals of differential amplifiers 131 and 132; and the output of the second voltage dividing circuit is branched into two, which are respectively connected to inverting terminals of the differential amplifiers 131 and 132. The output from the differential amplifier 132 is branched into two, which are respectively provided to the adders 101 and 102. The output from the differential amplifier 131 is branched into two, one of which is applied via an inverter 133 to the adder 101 and the other of which is applied directly to the adder 102. The amplification degrees of the differential amplifiers 131 and 132 selected to be 5/3 and $4a/3\omega_0$ respectively.

The phase shifter of the above construction is basically identical with the circuit arrangement of FIG. 17, but in FIG. 17, the coefficient $a/\omega_0$ is included in the amplification degree of each of the amplifiers 103, 104, 105 and 106, whereas in the embodiment of FIG. 24, the coefficient is included in the amplification degree of the differential amplifier 132 alone.

Accordingly, the coefficient $a/\omega_0$ can be made variable by making the amplification degree of the differential amplifier 132 variable. In this case, a maximum delay $\tau$ is in inverse proportion to the coefficient a as described previously, so that if $\omega_0$ is constant, then the maximum delay $\tau$ can be made variable.

In the case of the angular velocity $\omega_0$ at the center frequency being changed, if the amplification degree of the differential amplifier 132 is fixed, then the coefficient a varies in inverse proportion to the angular velocity $\omega_0$, resulting in the maximum delay being changed.

To avoid this defect, when the angular velocity $\omega_0$ is adjusted, the amplification degree of the differential amplifier 132 is also made variable in ganged relation to the means for adjusting $\omega_0$ in such a manner that the amplification degree of the differential amplifier 132 varies in inverse proportion to the angular valocity $\omega_0$.

In the above, the first and second voltage dividing circuits can each be formed not only by a capacitor and a resistor but also by an inductance and a resistor. For example, in FIG. 16, if inductances are used as the impedance circuits 107 and 109 and if resistors are used as the impedance circuits 108 and 110, then the other construction is identical with the basic circuit of FIG. 17 in the aforesaid case (i-3). If resistors are employed as the impedance circuits 107 and 109 and if inductances are employed as the impedance circuits 108 and 110, then the other circuit arrangement is identical with the basic circuit of FIG. 18 in the aforesaid case (ii-3).

What is claimed is:

1. A frequency characteristic adjusting circuit, comprising:
    (a) first adding means supplied with an input signal,
    (b) second adding means supplied with an output signal from said first adding means;
    (c) a filter circuit consisting of a series connection of a first resistor and a first capacitor and a parallel connection of a second resistor and a second capacitor, said series and parallel connections being connected in series and supplied with an output of said first adding means, the connection point between said series and parallel connections forming an output terminal of said filter circuit;

(d) feedback means for feeding back an output at said output terminal of said filter circuit to said first adding means;

(e) feedforward means for feeding forward the output at said output terminal of said filter circuit to said second adding means; wherein when a desired value of an angular velocity of a center frequency at a resonance point of a resonance characteristic of the frequency characteristic adjusting circuit is taken as $\omega_0$ and a desired value of a band width of said resonance characteristic is taken as $\Delta\omega$ said feedback means having a transfer factor $$3 - (1 + B)\frac{\Delta\omega}{\omega_o}$$

and said feedforward means having a transfer factor $$(1 + A)\frac{\Delta\omega}{\omega_o} - 3$$

where A and B are each constants; and (f) means for selecting one of said constants A and B as zero;

(g) said feedback means comprising a first feedback means for feeding back an output of said filter circuit, and a second feedback means for feeding back said output of said filter circuit through a transfer circuit having a transfer factor $\Delta\omega/\omega_0$ and said feedforward means comprises a first feedforward means for feeding forward the output of said filter circuit and a second feedforward means for feeding forward said output of said filter circuit through said transfer circuit.

2. A frequency characteristic adjusting circuit, comprising:

(a) first adding means supplied with an input signal, (b) second adding means supplied with an output signal from said first adding means;

(c) a filter circuit consisting of a series connection of a first resistor and a first capacitor and a parallel connection of a second resistor and a second capacitor said series and parallel connections being connected in series and supplied with an output of said first adding means, the connection point between said series and parallel connections forming an output terminal of said filter circuit;

(d) a feedback means for feeding back an output at said output terminal of said filter circuit to said first adding means; and, (e) a feedforward means for feeding forward the output at said output terminal of said filter circuit to said second adding means; wherein when a desired value of an angular velocity of a center frequency of the frequency characteristic adjusting circuit is taken as $\omega_0$ said feedback means having a transfer factor $$-2\frac{a}{\omega_0} + 3$$

and said feedforward means having a transfer factor $$-2\frac{a}{\omega_0} - 3$$

where a is constant, said feedback means comprising a first feedback means for feeding back an output of said filter circuit, and a second feedback means for feeding back said output of said filter circuit through a transfer circuit having a transfer factor $a/\omega_0$ and said feedforward means comprises a first feedforward means for feeding forward the output of said filter circuit, and a second feedforward means for feeding forward said output of said filter circuit through said transfer circuit.

3. A frequency characteristic adjusting circuit as claimed in claim 1 wherein said first and second resistors are varied in a ganged relation.

4. A frequency characteristic adjusting circuit as claimed in claim 2, wherein said first and second resistors are varied in a ganged relation.

5. A frequency characteristic adjusting circuit as claimed in claim 1, wherein said first and second capacitors are varied in a ganged relation.

6. A frequency characteristic adjusting circuit as claimed in claim 2, wherein said first and second capacitors are varied in a ganged relation.

7. A frequency characteristic adjusting circuit as claimed in claim 2, wherein said transfer circuit consists of a first voltage divider for dividing the output at the output terminal of said filter circuit and a second voltage divider for dividing an output voltage from said first voltage divider, said first voltage divider, first resistor and second resistor being varied in a ganged relation to vary a voltage dividing ratio of said first voltage divider in proportion to resistance values of said first and second resistors.

8. A frequency characteristic adjusting circuit comprising:

(a) adding means to which an input signal is applied;

(b) filter circuit means made of a series connection of a series circuit, consisting of a first resistor and a first capacitor and a parallel circuit consisting of a second resistor and a second capacitor, an output from said adding means being applied to said filter circuit means;

(c) means for deriving an output from a connection point between said series and parallel circuits of said filter circuit means;

(d) feedback means for feeding back the output from said filter circuit means to said adding means;

(e) leading-out means for leading out the output from said filter circuit means to an output terminal;

(f) means for making a transfer factor of said feedback means as $$3 - \frac{\Delta\omega}{\omega_0}$$

when a desired value of a resonance frequency of the frequency characteristic adjusting circuit is taken as $\omega_0$ and a desired value of a band width of a resonance characteristic thereof as and, (g) means for making a transfer factor of said leading out means as $\Delta\omega/\omega_0$ said feedback means consisting of a first feedback circuit which feeds back an output from said filter circuit means and a second feedback circuit having a transfer factor of $\Delta\omega/\omega_0$, said leading-out means using commonly said second feedback circuit.

9. A frequency characteristic adjusting circuit as claimed in claim 8 in which said first and second resistors are varied in a ganged relation.

10. A frequency characteristic adjusting circuit as claimed in claim 8 in which said first and second capacitors are varied in a ganged relation.

11. A frequency characteristic adjusting circuit, comprising:
   (a) a plurality of first adding means, each being supplied with an input signal;
   (b) second adding means supplied with an input signal;
   (c) a plurality of filter circuits connected respectively to outputs of said plurality of first adding means;
   (d) a plurality of variable resistors, each being grounded at its middle point;
   (e) a plurality of means for connecting the outputs of said filter circuits to movable pieces of said variable resistors, respectively, one end of said plurality of variable resistors being connected to corresponding input terminals of said plurality of first adding means and also to corresponding input terminals of said second adding means, respectively, and the other ends of said plurality of variable resistors being connected to corresponding input terminals of said second adding means, wherein an output signal is derived from said second adding means.

12. A frequency characteristic adjusting circuit, comprising:
   (a) first adding means supplied with an input signal,
   (b) second adding means supplied with an output signal from said first adding means;
   (c) first low pass filter circuit means consisting of a series connection of a first resistor and a first impedance;
   (d) second low pass filter circuit means consisting of a series connection of a second resistor and a second impedance, said first and second low pass filter circuit means being supplied with an output from said first adding means;
   (e) feedback means for feeding back an output from said first and second low pass filter circuit means to said first adding means;
   (f) feedforward means for feeding forward outputs from said first and second low pass filter circuit means to said second adding means; and
   (g) means for selecting respective values as follows:

$$\alpha_1 = \frac{2K(1+A)\Delta\omega}{3\omega_0} + \frac{4K^2+1}{3}$$

$$\alpha_2 = \frac{2K(1+A)\Delta\omega}{3\omega_0} - \frac{K^2+4}{3}$$

$$\beta_1 = -\beta_2 = \frac{2(1+B)\Delta\omega}{3\omega_0} - \frac{5}{3}$$

where $\alpha_1$ and $\alpha_2$ are respectively feedforward amounts from said first and second low pass filters, $\beta_1$ and $\beta_2$ are respectively feedback amounts from said first and second low pass filters, $\omega_o$ is a desired value of an angular velocity of a resonance frequency at a resonance point of the frequency characteristic adjusting circuit, $\Delta\omega$ is a band width, and A, B and K are respectively constants, said feedforward means having a first feedforward means for feeding forward outputs of said first and second low pass filters, a transmitting means having the transfer factor in proportion to a desired value $\Delta\omega/\omega_o$ or Q for being supplied with difference between the outputs of said first and second low pass filteres, and a second feedforward means for feeding forward an output of said transmitting means, and said feedback means having a first feedback means for feeding back outputs of said first and second low pass filters, and a second feedback means for feeding back the output of said transmitting means.

13. A frequency characteristic adjusting circuit, comprising:
   (a) first adding means supplied with an input signal,
   (b) second adding means supplied with an output signal from said first adding means;
   (c) first high pass filter circuit means consisting of a series connection of a first resistor and a first impedance;
   (d) second high pass filter circuit means consisting of a series connection of a second resistor and a second impedance, said first and second high pass filter circuit means being supplied with an output from said first adding means;
   (e) feedback means for feeding back an output from said first and second high pass filter circuit means to said first adding means;
   (f) feedforward means for feeding forward outputs from said first and second hgih pass filter circuit means to said second adding means; and
   (g) means for selecting respective values as follows:

$$\alpha_1 = \frac{2(1+A)\Delta\omega}{3K\omega_0} - \frac{1}{3K^2} - \frac{4}{3}$$

$$\alpha_2 = \frac{2(1+A)\Delta\omega}{3K\omega_0} + \frac{4}{3K^2} + \frac{1}{3}$$

$$\beta_1 = -\beta_2 = -\frac{2(1+B)\Delta\omega}{3\omega_0} + \frac{5}{3}$$

where $\alpha_1$ and $\alpha_2$ are respectively feedforward amounts from said first and second low pass filters, $\beta_1$ and $\beta_2$ are respectively feedback amounts from said first and second low pass filters, $\omega_o$ is a desired value of an angular velocity of a resonance frequency at a resonance point of the frequency characteristic adjusting circuit, $\Delta\omega$ is a band width, and A, B and K are respectively constants, said feedforward means having a first feedforward means for feeding forward outputs of said first and second high pass filters, a transmitting means having the transfer factor in proportion to a desired value $\Delta\omega/\omega_o$ or Q for being supplied with difference between the outputs of said first and second high pass filters, and a second feedforward means for feeding forward an output of said transmitting means, and said feedback means having feedback means for feeding back outputs of said first and second high pass filters, and a second feedback means for feeding back the output of said transmitting means.

14. A frequency characteristic adjusting circuit, comprising:
   (a) first adding means supplied with an input signal,
   (b) second adding means supplied with an output signal from said first adding means;
   (c) first low pass filter circuit means consisting of a series connection of a first resistor and a first impedance;
   (d) second low pass filter circuit means consisting of a series connection of a second resistor and a second impedance, said first and second low pass filter circuit means being supplied with an output from said first adding means;

(e) feedback means for feeding back an output from said first and second low pass filter circuit means to said first adding means;
(f) feedforward means for feeding forward outputs from said first and second low pass filter circuit means to said second adding means; and,
(g) means for selecting respective values as follows:

$$\alpha_1 = -\frac{2(1 + A)\Delta\omega}{3\omega_0} + \frac{4K + 1}{3}$$

$$\alpha_2 = \frac{2(1 + A)\Delta\omega}{3\omega_0} - \frac{K + 4}{3}$$

$$\beta_1 = -\beta_2 \frac{2(1 + B)\Delta\omega}{3\omega_0} - \frac{5}{3}$$

where $\alpha_1$ and $\alpha_2$ are respectively feedforward amounts from said first and second low pass filter, $\beta_1$ and $\beta_2$ are respectively feedback amount from said first and second low pass filters, $\omega_o$ is a desired value of an angular velocity of a resonance frequency at a resonance point of the frequency characteristic adjusting circuit, $\Delta\omega$ is a band width, and A, B and K are respectively constants,
said feedforward means having a first feedforward means for feeding forward outputs of said first and second low pass filters, a transmitting means having the transfer factor in proportion to a desired value $\Delta\omega/\omega_o$ or Q for being supplied with difference between the outputs of said first and second low pass filter, and a second feedforward means for feeding forward an output of said transmitting means, and said feedback means having a first feedback means for feeding back outputs of said first and second low pass filters, and a second feedback means for feeding back the output of said transmitting means.

15. A frequency characteristic adjusting circuit, comprising:
(a) first adding means supplied with an input signal,
(b) second adding means supplied with an output signal from said first adding means;
(c) first high pass filter circuit means consisting of a series connection of a first resistor and a first impedance;
(d) second high pass filter circuit means consisting of a series connection of a second resistor and a second impedance, said first and second high pass filter circuit means being supplied with an output from said first adding means;
(e) feedback means for feeding back an output from said first and second high pass filter circuit means to said first adding means;
(f) feedforward means for feeding forward outputs from said first and second high pass filter circuit means to said second adding means; and,
(g) means for selecting respective values as follows:

$$\alpha_1 = \frac{2(1 + A)\Delta\omega}{3K\omega_0} - \frac{1}{3K} - \frac{4}{3}$$

$$\alpha_2 = -\frac{2(1 + A)\Delta\omega}{3K\omega_0} + \frac{4}{3K} + \frac{1}{3}$$

$$\beta_1 = -\beta_2 = -\frac{2(1 + B)\Delta\omega}{3\omega_0} + \frac{5}{3}$$

where $\alpha_1$ and $\alpha_2$ are respectively feedforward amounts from said first and second low pass filters, $\beta_1$ and $\beta_2$ are respectively feedback amounts from said first and second low pass filters, $\omega_o$ is a desired value of an angular velocity of a resonance frequency at a resonance point of the frequency characteristic adjusting circuit, $\Delta\omega$ is a band width, and A, B and K are respectively constants,
said feedforward means having a first feedforward means for feeding forward outputs of said first and second high pass filters, a transmitting means having the transfer factor in proportion to a desired value $\omega/\omega_o$ or Q for being supplied with difference between the outputs of said first and second high pass filters, and a second feedforward means for feeding forward an output of said transmitting means, and said feedback means having a first feedback means for feeding back outputs of said first and second high pass filters, and a second feedback means for feeding back the output of said transmitting means.

16. A frequency characteristic adjusting circuit, comprising:
(a) first adding means supplied with an input signal,
(b) second adding means supplied with an output signal from said first adding means;
(c) first low pass filter circuit means consisting of a series connection of a first resistor and a first impedance;
(d) second low pass filter circuit means consisting of a series connection of a second resistor and a second impedance, said first and second low pass filter circuit means being supplied with an output from said first adding means;
(e) feedback means for feeding back an output from said first and second low pass filter circuit means to said first adding means;
(f) feedforward means for feeding forward outputs from said first and second low pass filter circuit means to said second adding means; and,
(g) means for selecting respective values as follows:

$$\alpha_1 = -\alpha_2 = \frac{5}{3} + \frac{4a}{3\omega_0}$$

$$\beta_1 = -\beta_2 = -\frac{5}{3} + \frac{4a}{3\omega_0}$$

where $\alpha_1$ and $\alpha_2$ are respectively feedforward amounts from said first and second low pass filters, $\beta_1$ and $\beta_2$ are respectively feedback amounts from said first and second low pass filters, $\omega_o$ is a desired value of an angular velocity of a resonance frequency at a resonance point of the frequency characteristic adjusting circuit, $\Delta\omega$ is a band width, and A, B and K are respectively constants,
said feedforward means having a first feedforward means for feeding forward outputs of said first and second low pass filters, a transmitting means having the transfer factor in proportion to a desired value $\Delta\omega/\omega_o$ or Q for being supplied with difference between the outputs of said first and second low pass filters, and a second feedforward means for feeding forward an output of said transmitting means, and said feedback means having a first feedback means for feeding back outputs of said first and second low pass filters, and a second feedback means for feeding back the output of said transmitting means.

17. A frequency characteristic adjusting circuit, comprising:
(a) first adding means supplied with an input signal, (b) second adding means supplied with an output signal from said first adding means;

(c) first high pass filter circuit means consisting of a series connection of a first resistor and a first impedance;

(d) second high pass filter circuit means consisting of a series connection of a second resistor and a second impedance, said first and second high pass filter circuit means being supplied with an output from said first adding means;

(e) feedback means for feeding back an output from said first and second high pass filter circuit means to said first adding means;

(f) feedforward means for feeding forward outputs from said first and second high pass filter circuit means to said second adding means; and, (g) means for selecting respective values as follows:

$$\alpha_1 = -\alpha_2 = -\frac{5}{3} - \frac{4a}{3\omega_0}$$

-continued
$$\beta_1 = -\beta_2 = \frac{5}{3} - \frac{4a}{3\omega_0}$$

where $\alpha_1$ and $\alpha_2$ are respectively feedforward amounts from said first and second low pass filters, $\beta_1$ and $\beta_2$ are respectively feedback amounts from said first and second low pass filters, $\omega_o$ is a desired value of an angular velocity of a resonance frequency at a resonance point of the frequency characteristic adjusting circuit, $\Delta\omega$ is a band width, and A, B and K are respectively constants, said feedforward means having a first feedforward means for feeding forward outputs of said first and second high pass filters, a transmitting means having the transfer factor in proportion to a desired value $\Delta\omega/\omega_o$ or Q for being supplied with difference between the outputs of said first and second high pass filters, and a second feedforward means for feeding forward an output of said transmitting means, and said feedback means having a first feedback means for feeding back outputs of said first and second high pass filters, and a second feedback means for feeding back the output of said transmitting means.

* * * * *